US006534395B2

(12) United States Patent
Werkhoven et al.

(10) Patent No.: US 6,534,395 B2
(45) Date of Patent: Mar. 18, 2003

(54) METHOD OF FORMING GRADED THIN FILMS USING ALTERNATING PULSES OF VAPOR PHASE REACTANTS

(75) Inventors: Christiaan J. Werkhoven, Tempe, AZ (US); Ivo Raaijmakers, Bilthoven (NL); Suvi P. Haukka, Helsinki (FI)

(73) Assignee: ASM Microchemistry Oy (FI)

(*) Notice: Subject to any disclaimer, the term of this patent is extended or adjusted under 35 U.S.C. 154(b) by 0 days.

(21) Appl. No.: 09/800,757

(22) Filed: Mar. 6, 2001

(65) Prior Publication Data

US 2001/0041250 A1 Nov. 15, 2001

Related U.S. Application Data

(60) Provisional application No. 60/187,423, filed on Mar. 7, 2000.

(51) Int. Cl.$^7$ .......................................... H01L 21/4763
(52) U.S. Cl. ....................... 438/627; 438/643; 438/653; 438/674; 438/678; 438/687; 438/783; 438/784; 438/785; 438/787
(58) Field of Search ................................ 438/787, 692, 438/788, 407, 302, 199, 216, 775, 627, 629, 643, 650, 653, 659, 674, 678, 680, 687, 783–785

(56) References Cited

U.S. PATENT DOCUMENTS

| | | |
|---|---|---|
| 4,058,430 A | 11/1977 | Suntola et al. |
| 4,486,487 A | 12/1984 | Skarp |
| 4,747,367 A | 5/1988 | Posa |
| 4,761,269 A | 8/1988 | Conger et al. |
| 5,071,670 A | 12/1991 | Kelly |
| 5,294,286 A | 3/1994 | Nishizawa et al. ......... 156/610 |
| 5,306,666 A | 4/1994 | Izumi |

(List continued on next page.)

FOREIGN PATENT DOCUMENTS

| | | |
|---|---|---|
| GB | 2372042 A | 8/2002 |
| GB | 2372043 A | 8/2002 |

(List continued on next page.)

OTHER PUBLICATIONS

Marko Vehkamäki, et al., *Growth of $SrTiO_3$ and $BaTiO_3$ Thin Films by Atomic Layer Deposition*, Department of Chemistry, University of Helsinki, FIN–00014, Helsinki, Finland, Electronic and Solid State Letters, 2 (10) (1999) Letters Online.

(List continued on next page.)

*Primary Examiner*—Amir Zarabian
*Assistant Examiner*—Khanh B. Duong
(74) *Attorney, Agent, or Firm*—Knobbe, Martens, Olson & Bear LLP

(57) ABSTRACT

Thin films are formed by atomic layer deposition, whereby the composition of the film can be varied from monolayer to monolayer during cycles including alternating pulses of self-limiting chemistries. In the illustrated embodiments, varying amounts of impurity sources are introduced during the cyclical process. A graded gate dielectric is thereby provided, even for extremely thin layers. The gate dielectric as thin as 2 nm can be varied from pure silicon oxide to oxynitride to silicon nitride. Similarly, the gate dielectric can be varied from aluminum oxide to mixtures of aluminum oxide and a higher dielectric material (e.g., $ZrO_2$) to pure high k material and back to aluminum oxide. In another embodiment, metal nitride (e.g., WN) is first formed as a barrier for lining dual damascene trenches and vias. During the alternating deposition process, copper can be introduced, e.g., in separate pulses, and the copper source pulses can gradually increase in frequency, forming a graded transition region, until pure copper is formed at the upper surface. Advantageously, graded compositions in these and a variety of other contexts help to avoid such problems as etch rate control, electromigration and non-ohmic electrical contact that can occur at sharp material interfaces.

33 Claims, 8 Drawing Sheets

U.S. PATENT DOCUMENTS

| | | | |
|---|---|---|---|
| 5,449,314 A | * 9/1995 | Meikle et al. | 438/692 |
| 5,769,950 A | 6/1998 | Takasu et al. | |
| 5,795,495 A | * 8/1998 | Meikle | 216/88 |
| 5,916,365 A | 6/1999 | Sherman | |
| 6,174,799 B1 | 1/2001 | Lopatin et al. | |
| 6,174,809 B1 | 1/2001 | Kang et al. | |
| 6,294,836 B1 | 9/2001 | Paranjpe et al. | |
| 6,329,704 B1 | * 12/2001 | Akatsu et al. | 257/655 |
| 6,362,526 B1 | 3/2002 | Pramanick et al. | |
| 6,365,502 B1 | 4/2002 | Paranjpe et al. | |
| 6,368,954 B1 | 4/2002 | Lopatin et al. | |
| 6,368,961 B1 | 4/2002 | Lopatin et al. | |
| 6,399,522 B1 | * 6/2002 | Tsan et al. | 438/788 |
| 2002/0006468 A1 | 1/2002 | Paranjpe et al. | |
| 2002/0102838 A1 | 8/2002 | Paranjpe et al. | |

FOREIGN PATENT DOCUMENTS

| | | |
|---|---|---|
| GB | 2372044 A | 8/2002 |
| WO | WO 00/54320 | 9/2000 |
| WO | WO 00/61833 | 10/2000 |

OTHER PUBLICATIONS

Per Martensson, et al., *Use of Atomic Layer Expitaxy for Fabrication of Si/TiN/Cu Structures*, J. Vac Sci. Technol.B 17(5), Sep./Oct. 1999, pp. 2122–2128.

Mikko Ritala, et al., *Zirconium Dioxide Thin Films Deposited by ALE Using Zirconium Tetrachloride as Precursor*, Applied Surface Science, 75 (1994(pp, 333–340.

Jae–Sik Min, et al., *Atomic Layer Deposition of TiN Films by Alternate Supply of Tetrakis (ethylmethylamino)–Titatium and Ammonia*, Jpn. J. Appl. Phys. vol. 37 (1998) pp. 4999–5004.

Kaupo Kukli, et al., *Atomic Layer Epitxy Growth of Tantalum Oxide Thin Films from Ta(OC2H$_5$) and H$_2$O*, J. Electrochem. Soc. vol. 142, No. 5, May 1995 pp. 1670–1674.

L. Hiltunen, et al., *Nitrides of Titanium, Niobium Tantalum and Molybdenum Grown as Thin Films by the Atomic Layer Epitaxy Method*, Thin Solid Films, 166 (1988) pp. 149–154.

M. Tiitta, et al., *Preparation and Characterization of Phosphorus–Doped Aluminum Oxide Thin Films*, Materials Research Bulletin, vol. 33, No. 9 pp. 1315–1323 1998.

B. Abeles, et al., *Amorphous Semiconductor Superlattices*, Physical Review Letters, Vo. 51, No. 21, pp. 2003–2006.

O. Sneh, et al., *Atomic Layer Growth of SiO$_2$ on Si(100) Using SiCl$_4$ and H$_2$O in a Binary Reaction Sequence*, Surface Science 334 (1995) 135–152.

Hiroyuki Sakaue, et al., *Digital Chemical Vapor Deposition of SiO$_2$ Using a Repetitive Reaction of Triethylsilane/Hydrogen and Oxidation*, Japanese Journal of Applied Physics, vol. 30, No. 1B, Jan. 1990, pp. L124–L127.

Michael L. Wise, et al, *Diethyldiethoxysilane as a New Precursor for SiO$_2$ Growth of Silicon*, Mat. Res. Soc. Symp. Proc. vol. 334, pp/ 37–43.

Lauri Niinistö, et al., *Synthesis of Oxide Thin Films and Overlayers by Atomic Layer Epitaxy for Advanced Applications*, Materials Science and Engineering B41 (1996) 23–29.

Mikko Ritala, et al, *Perfectly Conformal TiN and Al$_2$O$_3$ Films Deposited by Atomic Layer Deposition*, Communications, Chemical Vapor Deposition 1999, 5, No. 1, pp. 7–9.

Takeshi Kaizuka, et al., *Conformal Chemcial Vapor Deposition TiN (111) Film Formation as an Underlayer of Al for Highly Reliable Interconnects*, jpn. J. Appl. Phys. vol. 33 (1994) pp. 470–474.

Mikko Ritala, et al., *Atomic Layer Epitaxy Growth of tiN Thin Films from TiI$_4$ and NH$_3$*, J. Electrochemical Soc., vol. 145, No. 8, Aug. 1998 pp. 2914–2920.

Jae–Sik Min, et al., *Atomic Layer Deposition of TiN Thin Films by Sequential Infroduction of Ti precursor and NH$_3$*, Mat. Res. Soc. Symp. Proc. vol. 514 1998 Materials Research Society.

Tiita, et al. , *Phosphorus–Doped Alumina*, vol. 33, No. 9 pp. 1319–1323.

Sun–Oo Kim, et al., *The Effects of Substrate and Annealing Ambient on the Electrical Properties of Ta$_2$O$_5$ Thin Films Prepared By Plasma Enhanced Chemcial Vapor Deposition*, Thin Film Solids 253 (1994) pp. 453–439.

Chandra S. Desu, et al, *Enhanced Dielectric Properties of Modified Ta$_2$O$_5$ Thin Films*, Mat. Res. Innovat (1999) 2:299–302.

Takamaro Kikkawa, et al., *A Quarter–Micrometer Interconnection Technology Using a TiN/Al–Si–Cu/TiN/A1–Si–Cu/TiN/Ti Multilayer Structure*, IEEE Transactions on Electron Devices, vol. 40, No. 2 Feb. 1993.

T. Kikkawa, et al., *Al–Si–Cu/TiN Multilayer Interconnection and Al–Ge Reflow Sputtering Technologies for Quarter–Micron Devices*, 54/SPIE vol. 1805 Submicrometer Metalization (1992).

M. Leskelä, et al., *Atomic Layer Epitaxy in Deposition of Various Oxide and Nitride Thin Films*, Journal De Physique IV, Colloque C5, Supplement au Journal de Physique II, vol. 5, Jun. 1995.

*Atomic Layer Deposition Targets Thin Films*, Wafer Processing, Semiconductor International, Sep. 1999.

Jarkko Ihanus, et al, *ALE Growth of ZnS$_{1-x}$Se$_x$ Thin Films by Substrating Surface Sulfur with Elemental Selenium*, Applied Surface Science 112 (1997) 154–158.

Bai, G., "High K Gate Stack for Sub–0.1 UM CMOS Technology," *Electrochemical Society Proceedings*, vol. 99–10, pp. 39–44 (1999).

Lee et al., JP 2000058777 (English Abstract).

Lucovsky, G., "Integration of Alternative High–K Gate Dielectrics into Agressively Scaled CMOS Si Devices: Chemical Bonding Constraints at Si–Dielectric Interfaces," *Electrochemical Society Proceedings*, vol. 99–10, pp. 69–80 (1999).

Nakajima, A. et al., "Atomic–layer–deposited silicon–nitride/SiO$_2$ stacked gate dielectrics for highly reliable p–metal–oxide–semiconductor field–effect transistors," *Applied Physics Letters*, vol. 77, No. 18, pp. 2855–2857 (2000).

Nakajima, A. et al., "Low–temperature formation of silicon nitride gate dielectrics by atomic–layer deposition," *Applied Physics Letters*, vol. 79, No. 5, pp. 665–667 (2001).

Ritala, M. et al., "Controlled Growth of TaN, Ta$_3$N$_5$, and TaO$_x$N$_y$ Thin Films by Atomic Layer Deposition," *Chem. Mater.*, vol. 11, pp. 1712–1718 (1999).

Maiti, B. et al., "Improved ultrathin oxynitride formed by thermal nitridation and low pressure chemical vapor deposition process," *Applied Physics Letters*, vol. 61, No. 15, pp. 1790–1792 (1992).

del–Prado, A. et al., "Full composition range silicon oxynitride films deposited by ECR–PECVD at room temperature," *Thin Solid Films*, vols. 344–344, pp. 437–440 (1999).

* cited by examiner

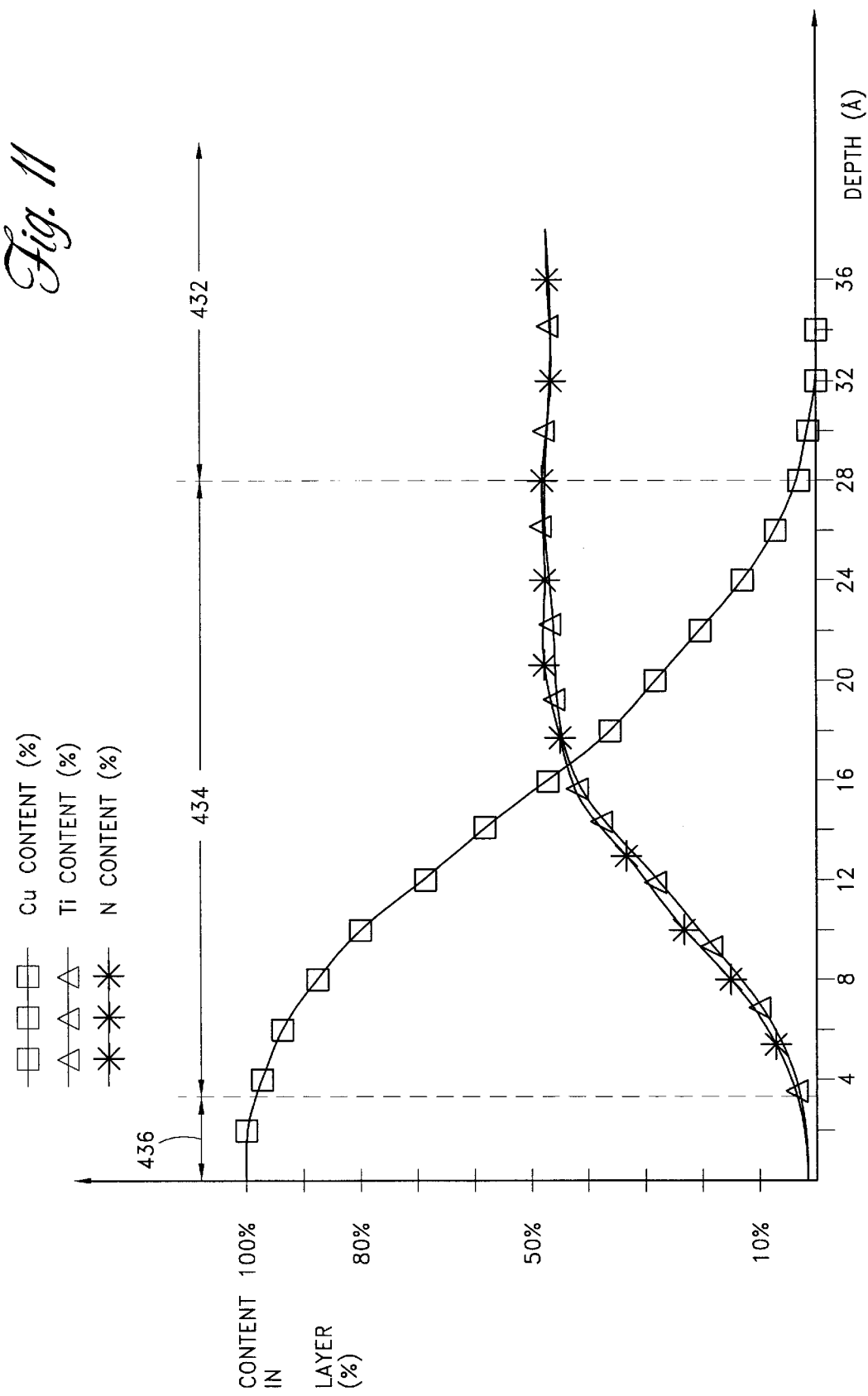

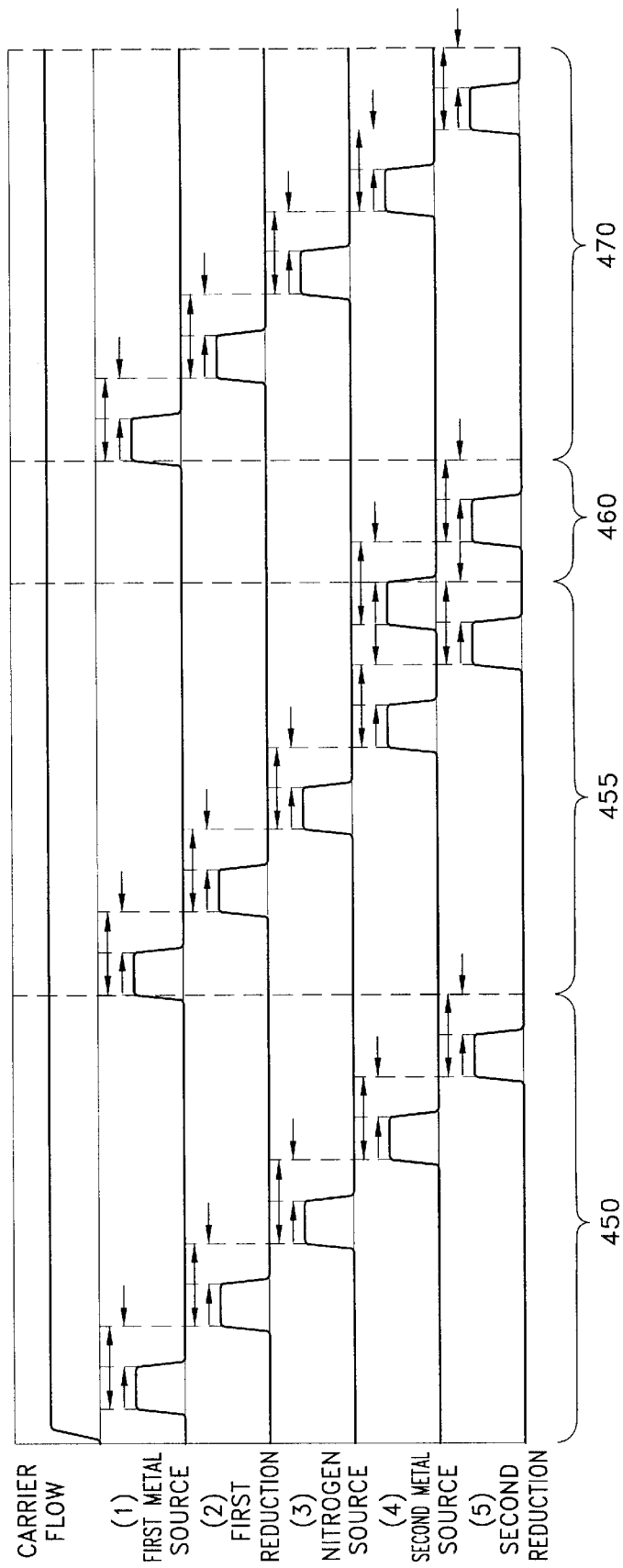

METHOD OF FORMING GRADED THIN FILMS USING ALTERNATING PULSES OF VAPOR PHASE REACTANTS

REFERENCE TO RELATED APPLICATION

The present application claims the priority benefit under 35 U.S.C. §119(e) to provisional application No. 60/187,423, filed Mar. 7, 2000.

FIELD OF THE INVENTION

The present invention relates generally to forming layers in integrated circuits, and more particularly to depositing thin films with graded impurity concentrations.

BACKGROUND OF THE INVENTION

There are numerous semiconductor process steps involved in the development of modem day integrated circuits (ICs). From the initial fabrication of silicon substrates to final packaging and testing, integrated circuit manufacturing involves many fabrication steps, including photolithography, doping, etching and thin film deposition. As a result of these processes, integrated circuits are formed of microscopic devices and wiring amid multiple layers.

A basic building block of the integrated circuit is the thin film transistor (TFT). The transistor includes a gate dielectric layer sandwiched between a "metal" layer and the semiconductor substrate, thus the acronym "MOS" for metal-oxide-semiconductor. In reality, the gate electrode is typically formed of conductively doped silicon rather than metal. The gate dielectric most commonly employed is $SiO_2$ or silicon dioxide.

Today's market demands more powerful and faster integrated circuits. In pursuit of such speed and lower power consumption, device packing densities are continually being increased by scaling down device dimensions. To date, this scaling has reduced gate electrode widths to less than 0.25 $\mu$m. Currently, commercial products are available employing gate widths or critical dimensions of 0.18 $\mu$m or less. The scaling rules that apply to these small devices call for very thin gate oxide layers, which have grown smaller with each generation of MOS integrated circuits. The thickness of gate oxides is made as small as possible, thereby increasing switching speed. Conventional gate oxide layers may be inadequate in several respects as dimensions are continuously scaled.

Extremely thin silicon dioxide gate dielectrics exhibit undesirable phenomena such as quantum-mechanical tunneling. In the classical sense, the oxide represents a relatively impenetrable barrier to injection of electrons into the conduction-band of the silicon if they possess kinetic energies smaller than 3.1 eV. However, the electron exhibits a finite probability of crossing the barrier even if the electron does not possess sufficient kinetic energy. This probability increases with larger gate electric fields and/or thinner gate oxides. For oxide thicknesses smaller than 3 nm the direct tunneling current becomes large enough that it removes carriers faster than they can be supplied by thermal generation. As a result, silicon dioxide gate dielectrics are likely to reach a lower scaling limit of about 1.5 nm to 2 nm.

Another problem with thin gate oxides is their susceptibility to dopant diffusion from the overlying gate electrode. A polysilicon gate electrode layer is typically doped with boron for its enhanced conductivity. As the gate oxide thickness is scaled down, boron can easily penetrate through the gate oxide, resulting in instabilities in device properties. Boron penetration into gate dielectrics has such undesirable consequences as positive shifts in threshold voltage, increases in sub-threshold swing, increases in charge trapping, decreases in low-field hole mobility, and degradation of current drive due to polysilicon depletion in p-MOSFETs.

Efforts to address deficiencies of silicon dioxide include nitrogen incorporation into the gate dielectric. Silicon nitride ($Si_3N_4$) has a higher dielectric constant than $SiO_2$, theoretically enabling thinner equivalent oxide thickness for gate dielectrics that are not tunnel-limited, and furthermore serves as an effective barrier against impurity diffusion. However, the interfaces between silicon nitride films and the underlying semiconductor substrate are generally of poor quality, resulting in a high density of charge trapping sites and pinholes, and attendant current leakage. As a consequence, attempts have been made to create $SiO_2$ and $Si_3N_4$ hybrids, such as silicon oxynitride films, for use as gate dielectrics. Conventional methods of incorporating nitrogen into silicon oxide gate dielectrics are difficult to control, however, particularly for ultra-thin gate dielectrics of future generation devices Other solutions to scaling problems include the use of high permittivity materials (high K), such as tantalum pentoxide, strontium bismuth tantalate (SBT), barium strontium tantalate (BST), etc. While exhibiting greatly increased dielectric strength, these materials have been difficult to integrate with existing fabrication technology.

Another issue raised by the continual scaling of integrated circuit dimensions is the difficulty of producing adequately conductive metal lines for wiring the circuitry within integrated circuits. One manner of simplifying the process of metallization is by employing damascene techniques. Rather than depositing blanket metal layers and etching away excess metal to leave wiring patterns, damascene processing involves forming templates for wiring by way of trenches in an insulating layer. Metal overfills the trenches and a polishing step removes excess metal outside the trenches. Metal is thus left in a desired wiring pattern within the trenches. Where contact holes or vias extending from the floor of the trenches to lower conductive elements are simultaneously filled with metal, the method is known as dual damascene processing.

Unfortunately, scaling introduces difficulties with damascene processes, particularly when fast diffusing metals like copper are employed for the metal lines and contacts. In order to prevent peeling of metal lines from the surrounding insulation and to prevent diffusion spikes causing shorts across lines, one or more lining layers are formed within the trenches (and vias, in dual damascene processing) prior to metal fill. Typically, metal adhesion layers and metal nitride barrier layers are employed. A metal seed layer may also be needed if the trenches are to be filled by electroplating.

These lining layers occupy a considerable volume of the available trenches, reducing room available for the more highly conductive metal filler. Conductivity is thus reduced relative to the same trenches filled completely with metal. Moreover, employing metal nitride liners, though advantageously containing the metal filler and preventing short circuits, has been known to induce electromigration during circuit operation, leading to voids and further reduced conductivity along the metal lines.

Accordingly, a need exists for thin films that overcome problems associated with gate dielectrics constructed of traditional materials such as silicon nitride and silicon oxide. A need also exists for improved structures and methods for containing metal within damascene trenches without excessive losses in conductivity.

SUMMARY OF THE INVENTION

The aforementioned and other needs are satisfied by several aspects of the present invention.

In accordance with one aspect of the invention, a thin film is provided in an integrated circuit. The film has a small thickness, defined between an upper surface and a lower surface. A controlled, varying composition is provided through this small thickness. Exemplary thicknesses are preferably less than about 100 Å, more preferably less than about 50 Å and can be on the order of 10 Å.

In accordance with one embodiment, the film comprises a gate dielectric for an integrated thin film transistor. In one arrangement, a silicon oxide layer is provided with a graded concentration of nitrogen. Despite the thinness of the layer, such a gradient can be maintained. Advantageously, a relatively pure silicon dioxide can be provided at the lower level for a high quality channel interface, while a high nitrogen content at the upper surface aids in resisting boron diffusion from the polysilicon gate electrode. In another arrangement, other dielectric materials can be mixed in a graded fashion to obtain desirable interface properties from one material and desirable bulk properties from another material, without undesirable sharp interfaces within the gate dielectric. For example, $Al_2O_3$ has a high dielectric constant and desirable interface properties, while $ZrO_2$ has yet a higher dielectric constant, which is desirable for the "bulk" of the gate dielectric.

In accordance with a second embodiment, the film comprises a transition layer between a barrier film and a more conductive wiring material. In the illustrated embodiment, a thin metal nitride layer is provided with a graded concentration of copper. The nitride layer can be made exceedingly thin, leaving more room for more conductive metal within a damascene trench, for example. Advantageously, an effective diffusion barrier with metal nitride can be provided at the lower surface, while a high copper content at the upper surface provides the conductivity needed for service as an electroplating seed layer. The gradual transition also reduces electromigration, as compared to structures having sharp barrier-metal interfaces.

In accordance with another aspect of the invention, a method is provided for forming a thin film in an integrated circuit, with varying composition through its thickness. The method includes alternatingly introducing at least a first species and a second species to a substrate in each of a plurality of deposition cycles while the substrate is supported within a reaction chamber. A third species is introduced to the substrate in a plurality of the deposition cycles. The amount of the third species can vary in the different cycles in which it is introduced. Alternatively, the third species is supplied in its own source gas pulse, which pulse is employed with increasing or decreasing frequency as the thin film deposition proceeds (e.g., none during a first stage, every fourth cycle during a second stage, every cycle during a third stage, etc.).

Advantageously, the amount of the impurity varies between zero during early deposition cycles and a maximum amount during late deposition cycles. In one example, a silicon source gas adsorbs upon the substrate in a first phase of each cycle, while an oxidant source gas in a second phase of the cycle forms silicon oxide. After a relatively pure silicon oxide covers the substrate surface, small amounts of a nitrogen source gas are introduced during the second phase. The amount of nitrogen source gas increases with each cycle thereafter. The amount of oxidant during the second phase can also decrease, such that a pure silicon nitride upper surface most preferably results, with graded nitrogen content between the upper and lower surfaces of the dielectric. Similarly, in a second example, tungsten, reducing and nitrogen sources provide metal nitride in first through third phases. A copper source and reducing agents in fourth and fifth phases provide copper. In successive cycles, the relative proportions of the first through third phases (producing no more than about one monolayer of WN) and the fourth through fifth phases (producing no more than about one monolayer of Cu) changed. The increases/reductions can be altered step-wise, e.g., every two cycles, every three cycles, every five cycles, etc.

According to another aspect of the invention, selectively introduced impurity phases or pulses can replace atoms of a previous phase in a thermodynamically favored substitution reaction. Grading can be accomplished by varying the frequency of the impurity phase through the atomic layer deposition process. Alternatively, the frequency of the impurity phase can be kept constant while the duration of the impurity phase is varied throughout the deposition process, or a combination of varying frequency and duration can be employed.

Due to the fine control provided by atomic layer deposition, this grading can be provided in very thin layers. Moreover, the low temperatures during the process enables maintenance of the desired impurity content profile.

BRIEF DESCRIPTION OF THE DRAWINGS

These and further aspects of the invention will be readily apparent to those skilled in the art from the following description and the attached drawings, wherein:

FIG. 11 is a theoretical Auger profile of a graded barrier-to-metal transition region, constructed in accordance with a preferred embodiment.

FIG. 12 is an exemplary gas flow diagram in accordance with one embodiment for depositing graded conductive layers.

DETAILED DESCRIPTION OF THE PREFERRED EMBODIMENTS

Figure 1:
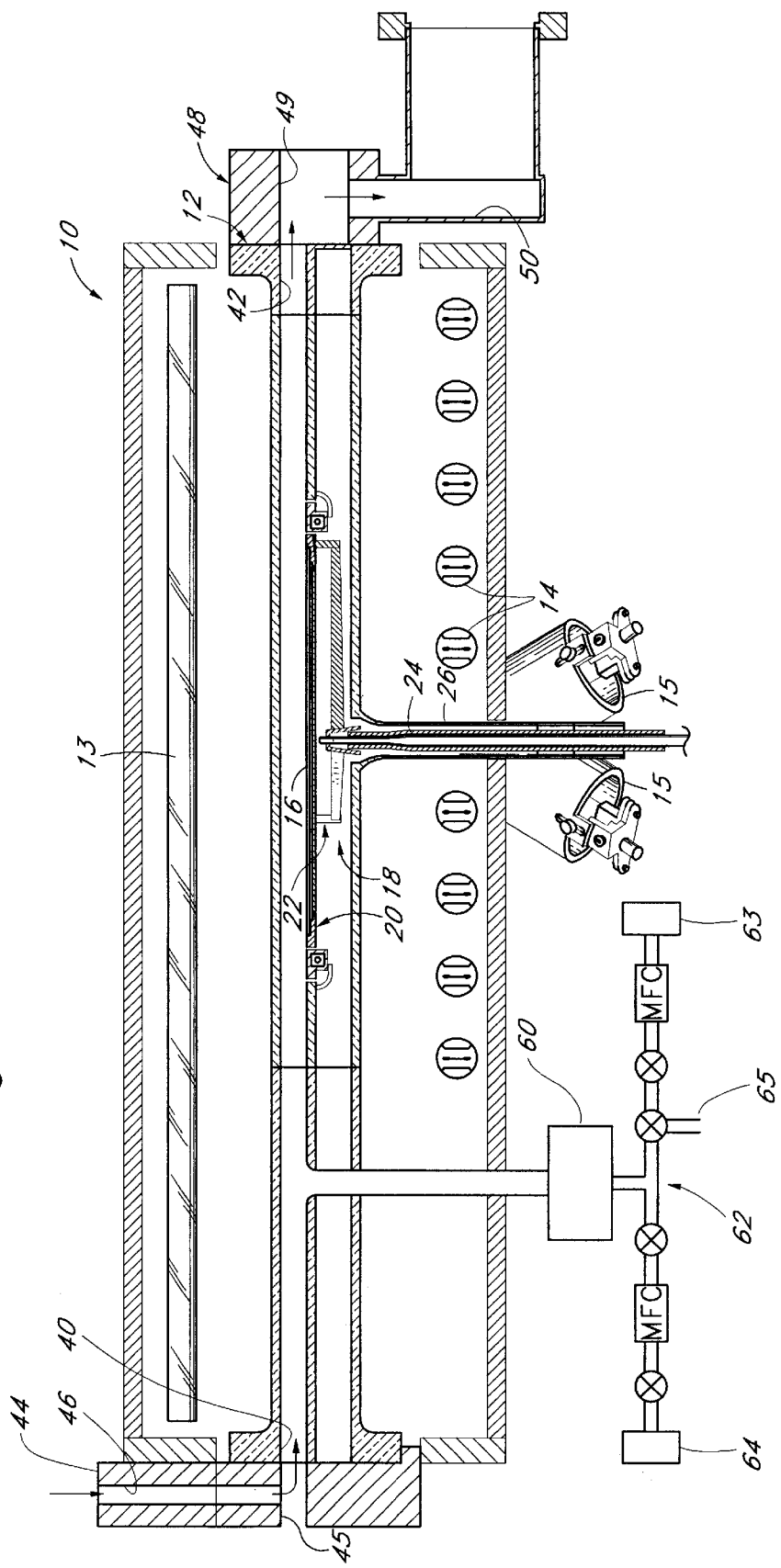
FIG. 1 is a partially schematic, sectional view of a single-substrate reaction chamber, including some surrounding reactor components, for use in conjunction with preferred embodiments of the present invention.

Although described in the context of graded gate dielectric layers in an integrated transistor stack and graded transitions from barrier to metal layers, the skilled artisan will readily find application for the principals disclosed here in a number of other contexts. The processes and layer structures disclosed herein have particular utility where extremely thin layers are desired with tailored concentrations of impurities through the thickness of the layer.

It is often desirable to provide a graded or otherwise varying composition through the thickness of a film in an integrated circuit. Sharp boundaries between different layers can disadvantageously demonstrate poor adhesion, undesirable electrical qualities, lack of process control, etc.

For very thin films, for example thinner than 10 nm, it is very difficult to realize precisely tailored profiles with conventional fabrication methods. The preferred embodiments, however, employ atomic layer deposition (ALD), which facilitates the formation of thin films monolayer by monolayer. Indeed, control exists on a smaller than monolayer scale, due to steric hindrance of bulky source chemical molecules producing less than one monolayer per cycle. The capability of layering atomically thin monolayers enables forming more precise concentration gradients from the lower surface (e.g., gate oxide/Si substrate interface) to the upper surface (e.g., gate electrode/gate dielectric interface).

Accordingly, the preferred embodiments provide methods of more precisely tailoring impurity content in thin layers formed within integrated circuits. The illustrated embodiments described below thus include methods of building up a thin film in discrete steps of monolayers of material and are thus species of atomic layer deposition (ALD). The composition of each discrete layer can be tailored by selectively introducing the desired chemistry for each monolayer to be deposited. For example, by means of ALD, a particular combination of introduced gases react with, deposit or adsorb upon the workpiece until, by the nature of the deposition chemistry itself, the process self-terminates. Regardless of the length of exposure, the process gases do not contribute further to the deposition. To deposit subsequent monolayers, different chemical combinations are introduced in the process chamber such as will react with or adsorb upon the previously formed monolayer. Desirably, the second chemistry or a subsequent chemistry forms another monolayer, also in a self-limiting manner. These self-limiting monolayers are alternated as many times as desired to form a film of suitable thickness.

The very nature of this method allows a change of chemistry for each discrete cycle. Accordingly, the composition of the resulting thin film can be changed incrementally, for example, in each cycle, in every second cycle, or in any other desired progression. Additionally, because ALD can be conducted at very low temperatures, relative to conventional thermal oxidation and conventional CVD processes, diffusion during the process can be effectively limited. For the purpose of illustrating a ratio between oxide thickness and corresponding number of layers, a thin film of 2-nm silicon oxide, for example, contains about seven (7) monolayers. In accordance with the illustrated embodiment, seven monolayers of silicon oxide can be formed in about 18 –22 cycles of an ALD process. Thus, even for such an extremely thin layer, the composition can be changed such that a different impurity concentration can be incorporated into the first monolayer as compared to that incorporated into the seventh monolayer.

Preferred Process Reactor

FIG. 1 shows a chemical vapor deposition (CVD) reactor 10, including a quartz process or reaction chamber 12, constructed in accordance with a preferred embodiment, and for which the methods disclosed herein have particular utility. The illustrated reactor 10 comprises a process module commercially available under the tradename Epsilon™ from ASM America, Inc., of Phoenix, Ariz., adapted to include a remote plasma source. While the preferred embodiments are discussed in the context of a single-substrate CVD reactor, it will be understood that the disclosed processes will have application in CVD reactors of other types, having reaction chambers of different geometries from those discussed herein. In other arrangements, the preferred processes can be conducted in a reactor commercially available under the trade name Pulsar™ 2000 from ASM Microchemistry, Ltd. of Finland, specifically designed for ALD.

A plurality of radiant heat sources are supported outside the chamber 12, to provide heat energy to the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the wafer support structure, to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A workpiece or substrate, preferably comprising a silicon wafer 16, is shown supported within the reaction chamber 12 upon a substrate or wafer support structure 18. Note that, while the substrate of the illustrated embodiment is a single-crystal silicon wafer, it will be understood that the term "substrate" broadly refers to any structure on which a layer is to be deposited. The support structure 18 includes a susceptor 20, a quartz support spider 22 extending from a shaft 24 through a depending tube 26, and numerous surrounding elements that facilitate laminar gas flow and uniform temperatures across the wafer 16.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 44 is fitted to the reaction chamber, adapted to surround the inlet port 40, and includes a horizontally elongated slot 45 through which the wafer 16 can be inserted. The slot 45 is selectively sealed by a gate valve (not shown) during operation. A generally vertical inlet 46 receives gases from remote sources, and communicates such gases with the slot 45 and the inlet port 40.

The reactor also includes remote sources (not shown) of process gases, which communicate with the inlet 46 via gas lines with attendant safety and control valves, as well as mass flow controllers ("MFCs") that are coordinated at a gas panel, as will be understood by one of skill in the art.

For the first illustrated embodiment, gas sources include tanks holding a silicon-containing gas, preferably a silane such as monosilane ($SiH_4$), silicon tetrachloride ($SiCl_4$), dichlorosilane (DCS or $SiH_2Cl_2$), trichlorosilane (TCS or $SiHCl_3$), or other silane or halosilane silicon sources; an oxidant source gas, such as $O_2$, $O_3$, O radicals, $H_2O$, NO or $N_2O$; and a nitrogen source gas, such as $NH_3$. Metal source gases can also be employed for deposition of high k metal oxides. For the second embodiment, source gases include one or more metal source gases (e.g., $WF_6$, $TiCl_4$, CuCl, etc.), a nitrogen source gas (e.g., $NH_3$) and a reducing agent (e.g., triethyl boron or TEB).

The silicon sources can include a bubbler and a gas line for bubbling $H_2$ through a liquid solution such as TCS, to more effectively transport silicon-containing gas molecules to the reaction chamber in gaseous form. Many metal sources can similarly include liquid solutions and bubblers. The reactor 10 can also include other source gases, such as dopant gases, including phosphine ($PH_3$), arsine ($AsH_3$), and/or diborane ($B_2H_6$); etchants for cleaning the reactor walls (e.g., HCl); a germanium source for doping or formation of SiGe films; etc.

In the illustrated embodiment, an optional generator of excited species, commonly referred to as a remote plasma generator 60, is provided remotely or upstream from the reaction area, and preferably upstream from the chamber 12. An exemplary remote excited species generator is available commercially under the trade name TR-850 from Rapid Reactive Radicals Technology GmbH of Munich, Germany. As known in the art, the generator 60 couples power to a gas to generate excited species. In the illustrated embodiment, the generator 60 couples microwave energy from a magnetron to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas bombs, bubblers, etc., depending upon the form and volatility of the reactant species. Each gas line can be provided with separate mass flow controllers (MFC) and valves, as shown, to allow selection of relative amounts of carrier and reactant species introduced to the generator 60 and thence into the reaction chamber 12.

An outlet component 48 mounts to the process chamber 12 such that an exhaust opening 49 aligns with the outlet port 42 and leads to exhaust conduits 50. The conduits 50, in turn, communicate with suitable vacuum means (not shown) for drawing process gases through the chamber 12 and to reduce pressure, if desired.

Graded Gate Dielectrics

As noted above, the trend in integrated circuit fabrication is to further miniaturize devices. With devices getting smaller, it is becoming increasingly more difficult to deposit thin layers, such as gate oxide layers, by conventional means. Furthermore, the nature of silicon oxide layers will need to change to address desired electrical characteristics of gate dielectrics.

Gate dielectrics in integrated transistors should not only have low defect densities but should also resist diffusion of impurities from the overlying gate electrode into the gate dielectric. Silicon oxide has been successfully used now for decades as a gate dielectric material, but today's circuit designs impose the use of thinner and thinner layers. As a result of the thinner layers, dopant (e.g., boron) diffusion becomes more of a problem.

Incorporation of nitrogen into the gate dielectric film can effectively reduce boron diffusion. As has been recognized elsewhere in the art, however, nitride at the channel interface leads to poor interface properties and consequently poor electrical performance. Accordingly, a resultant dielectric structure has pure silicon oxide at the channel interface and silicon nitride at higher levels.

Conventionally, silicon oxide gate dielectric films are made by thermal oxidation of the underlying silicon substrate. To incorporate nitrogen, nitrogen-containing gases can be added to the main oxygen stream, and/or a post-deposition treatment can be performed with nitrogen-containing gases or nitrogen implantation. Such methods can either incorporate nitrogen into the oxide material to form silicon oxynitride ($SiO_xN_y$) or form a $Si_3N_4$ layer over the oxide. In either case, it is difficult to control the nitrogen content in the film, especially for current and future generation of integrated circuit devices where the gate dielectric material is very thin (e.g., less than 7 nm). For such ultrathin dielectrics, conventional methods of incorporating nitrogen into a gate dielectric cannot be controlled to produce uniform electrical characteristics across the substrate while still minimizing nitrogen content at the interface with the substrate.

The first embodiment involves alternating adsorption of no more than about a monolayer of silicon with oxidation of the previously adsorbed monolayer in an alternating layer silicon oxide process. During the oxidation stage, nitrogen can also be selectively incorporated. Essentially, by mixing these two gases, oxynitride films with any desired ratio of oxygen to nitrogen can be grown. In the preferred embodiment, varying reactant ratios during the cyclical process, the composition formed by each cycle can be tailored. Most preferably, the deposition begins with pure silicon oxide and ends with pure silicon nitride, with any desired grading through the thickness.

The substrate upon which deposition is to occur is initially prepared for the self-limiting deposition process. In the illustrated embodiment, the substrate is a semiconductor material in which a transistor channel is formed. The semiconductor substrate can be formed of an epitaxial layer or formed of the top portions of an intrinsically doped silicon wafer. In other arrangements, the substrate can comprise alternative materials, such as III–V semiconductors.

Surface preparation desirably leaves a surface termination that readily reacts with the first reactant in the preferred ALD process. In the illustrated embodiment, wherein a dielectric layer is to be formed over a single-crystal silicon layer or wafer, the bare silicon surface preferably is terminated with hydroxyl (OH) tails. As will be appreciated by the skilled artisan, such a surface termination can be readily obtained simply by exposure a clean room atmosphere after a wafer clean.

In accordance with the preferred embodiment, at least one workpiece or wafer is loaded into the process chamber and readied for processing. Purge gas is preferably flowed through the chamber to remove any atmospheric contaminants.

Temperature and pressure process parameters can be modified to attain the desired film characteristics. If necessary, the wafer is ramped to the desired process temperature by increasing power output to the lamps 13, 14 and 15. Advantageously, however, the illustrated self-limiting reaction can be conducted at low temperatures, such that the reactor can be maintained constantly at the reaction temperature without ramping between workpiece changes. The desired pressure level, if other than atmospheric, can be attained using a conventional vacuum pump as known by those skilled in the art. For the present silicon oxynitride process, for example, it is preferable to maintaining a process temperature of between about 100° C. and 500° C., more preferably between about 200° C. and 400° C., and most preferably between about 300° C. and 400° C. Desirably, the process is also relatively insensitive to pressure, though the preferable pressure range is between about 1 Torr and 100 Torr, and more preferably between about 5 Torr and 15 Torr.

In an alternate embodiment of the present invention, the self-limiting reaction can take place at even lower temperatures. Using remote-plasma excited oxygen and/or nitrogen sources, even room temperature processing is plausible. Consequently, inter-diffusion of the discrete layers can be avoided and as long as post-treatments at high temperatures do not take place in an environment of oxygen or nitrogen containing gases, the deposited composition profile will stay intact. As noted above, the plasma generator 60 of FIG. 1 can couple microwave energy to flowing reactant gases to ignite a plasma. Desirably, ionic species recombine prior to entering the process chamber, thereby minimizing damage to the workpiece and the chamber itself, while radicals such as N and O survive to provide boosted reactivity to the oxygen and/or N phases of the process.

When the workpiece is at the desired reaction temperature and the chamber is at the desired pressure level, process and carrier gases are then communicated to the process chamber. Unreacted process and carrier gas and any gaseous reaction by-products are thus exhausted. The carrier gas can comprise any of a number of known non-reactive gases, such as $H_2$ $N_2$, Ar, He, etc. In the illustrated embodiment, $N_2$ is used as the carrier gas.

A first chemical species is then adsorbed upon the prepared deposition substrate. In the illustrated embodiment, the first species comprises a silicon-containing species, and includes at least one other ligand that results in a self-terminating monolayer of the silicon-containing species. For example, the silicon source gas for the deposition of silicon oxide can include: silanes of the formula $Si_mL_{2m+2}$ wherein m is an integer 1–3; siloxanes of the formula $Si_yO_{y-1}L_{2y+2}$ wherein y is an integer 2–4; and silazanes of the $Si_y(NH)_{y-1}L_{2y+2}$ wherein y is an integer 2–4. In these formulae each L can independently be H, F, Cl, Br, I, alkyl, aryl, alkoxy, vinyl (—CH=$CH_2$), cyano (—CN), isocyanato (—NCO), amino, silyl ($H_3Si$—), alkylsilyl, alkoxysilyl, silylene or alkylsiloxane, whereby alkyl and alkoxy groups can be linear or branched and may contain at least one substitute. Volatile silanols and cyclic silicon compounds are examples of other suitable silicon source compounds.

Of these silicon compounds, preferably silanes and silazanes are used for the deposition of pure silicon nitride because siloxanes have a rather strong Si—O bond. Silicon compounds can be purchased, e.g., from Gelest, Inc., 612 William Leigh Drive, Tullytown, Pa. 19007-6308, United States of America.

Most preferably, the silicon source gas comprises dichlorosilane (DCS) or trichlorosilane (TCS) which is injected into the carrier gas flow. In the preferred reactor, the silicon source gas is flowed at a rate of between about 10 sccm and 500 sccm, more preferably between about 100 sccm and 300 sccm. The silicon source gas is maintained for between about 0.1 second and 1 second under the preferred temperature and pressure conditions, and more preferably for between about 0.3 second and 0.7 second. A monolayer of silicon chemisorbs on the silicon substrate surface terminated with chloride tails or ligands. The surface termination desirably inhibits further reaction with the silicon source gas and carrier gas.

After the pulse of the first species, a second species is provided to the substrate. In the illustrated embodiment, the second species comprises an oxidant, most preferably comprising pure $H_2O$ vapor. The $H_2O$ is preferably injected into the carrier gas flow at a rate of between about 10 sccm and 500 sccm, more preferably between about 100 sccm and 300 sccm. Under the preferred temperature and pressure conditions, the $H_2O$ pulse is maintained for between about 0.1 second and 1 second under the preferred temperature and pressure conditions, and more preferably for between about 0.3 second and 0.7 second. After the oxidant pulse is turned off, carrier gas is preferably allowed to flow for sufficient time to purge the oxidant from the chamber prior to the next reactant pulse. In other arrangements, it will be understood that the chamber can be evacuated to remove the second reactant species.

During the second reactant pulse, the oxidant reacts with the chloride termination of the previous pulse, leaving oxygen atoms in place of the ligands. Desirably, stoichiometric or near stoichiometric $SiO_2$ is left.

In accordance with the principals of atomic layer deposition, a second pulse of the silicon source gas is then injected into the carrier gas flow, the pulse is stopped and the silicon source gas removed from the chamber, followed by a second oxidant source gas pulse, which is then in turn stopped and removed from the chamber. These pulses are then continually alternated until the dielectric layer attains its desired thickness.

An impurity source gas is also provided to at least one of the cycles in the alternating process. In the dielectric embodiment shown, the impurity preferably comprises nitrogen, and the impurity source gas preferably comprises ammonia ($NH_3$) or hydrazine ($N_2H_4$) added to the alternating process. Both ammonia and hydrazine are fairly reactive gases, making them suitable for low temperature ALD processing. It will be understood, in view of the disclosed embodiment of FIGS. 9-12 below, that in one embodiment, the ammonia is added in separate ammonia phases (each comprising an ammonia pulse and a purge pulse) following silicon phases. The ammonia phases can gradually replace oxidant source gas phases, such as one every ten cycles, gradually increasing to one every other cycle and preferably ending with complete replacement of the oxidant phases. Thus, the alternating process begins depositing silicon oxide (by alternating silicon and oxidant phases); deposits a graded silicon oxynitride with increasing levels of nitrogen in an intermediate portion of the process (by gradually replacing an increasing proportion of the oxidant phases with nitrogen and particularly ammonia phases); and, by the time the desired dielectric thickness is reached, the alternating process deposits silicon nitride (by alternating silicon and ammonia phases).

In the illustrated embodiment, however, ammonia is added to the oxygen phase. Different amounts of $NH_3$ are added to different oxidant source gas pulses throughout the process. Thus, a desired amount of nitrogen can be selectively incorporated into each monolayer of silicon dioxide and a silicon oxynitride layer results with a tailored nitrogen content profile.

The skilled artisan will appreciate, in view of the present disclosure, that the reaction between ammonia and the silicon complex will have a different thermodynamic favorability, as compared to the reaction between the oxidant and the silicon complex. Accordingly, the proportions of ammonia to oxidant do not necessarily equal the proportions of nitrogen to oxygen in the resultant silicon oxynitride. The skilled artisan can readily account for thermodynamic competition through routine experimentation to determine the appropriate parameters for the desired levels of nitrogen incorporation. Providing nitrogen active species through a remote plasma generator, particularly in conjunction with oxygen active species, can maximize the effect of varying the ratio of oxygen to nitrogen sources.

Figure 7:
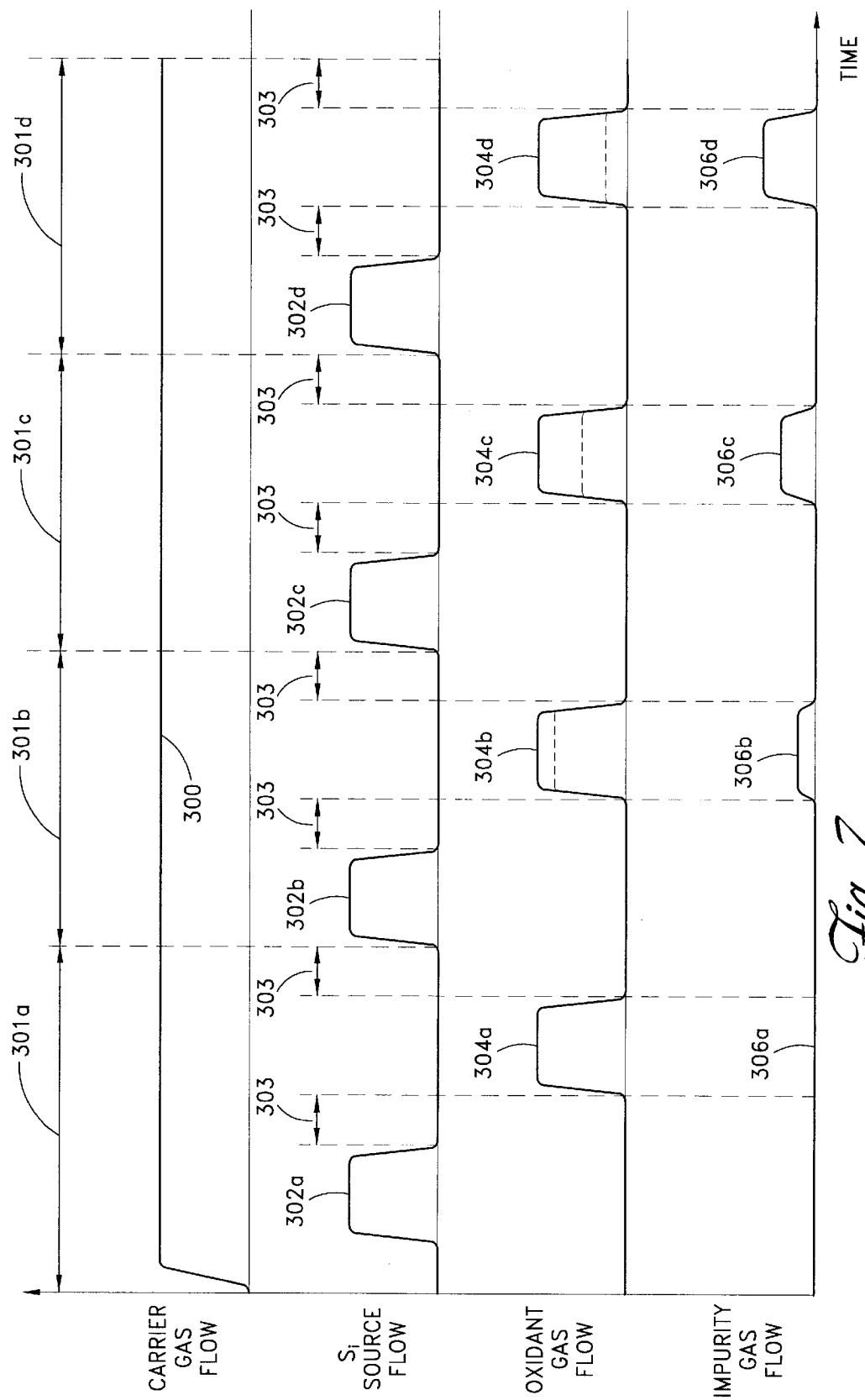
FIG. 7 is an exemplary gas flow diagram in accordance with a preferred method of depositing ultrathin graded dielectric layers.

FIG. 7 is a gas flow diagram in accordance with one embodiment, illustrating the first four cycles 301a–301d in an exemplary self-limiting deposition sequence. The illustrated sequence includes a constant flow of a carrier gas 300. As shown, a first pulse or spike 302a of the silicon source gas is provided to form the first self-terminated silicon monolayer. After a first purge step 303, during which carrier gas continues to flow until the silicon source gas has been removed from the chamber, a first oxidant source gas pulse or spike 304a is provided. After a second purge 303, a second silicon source gas pulse 302b is provided, followed by a second oxidant source gas 304b, a third silicon source gas pulse 302c, a third oxidant source gas pulse 304c, etc. in alternating pulses separated by purge steps 303.

As shown, at some point after the first cycle 301a (forming the first silicon oxide monolayer) a first impurity source gas pulse 306b is provided, preferably during an oxidant source gas pulse 304b. Desirably, a relatively low percentage of the impurity source gas (preferably comprising $NH_3$) is provided during this first pulse 306b. During subsequent oxidant source gas pulses 304c, 304d, etc., progressively greater flows of the impurity source gas are provided in pulses 306c, 306d, etc. Where progressively greater flows of the impurity source gas are employed, it can be advantageous to supply reactants perpendicularly to the substrate surface, such as by way of an overhead showerhead. In the case of competing adsorption of two source chemicals, all of the substrate surface is preferably exposed simultaneously to the gas mixture. Thus concentration gradients from the inlet side to the exhaust side of the substrate can be avoided.

Note that FIG. 7 is schematic only, and not drawn to scale. Additionally, the preferred process conditions actually result in a full monolayer formed after a plurality of cycles. While theoretically the reactants will chemisorb at each available site on the exposed layer of the workpiece, physical size of the adsorbed species (and particularly with terminating ligands) will generally limit coverage with each cycle to a fraction of a monolayer. In the illustrated embodiment, on average roughly 1 Å of $SiO_2$ forms per cycle, whereas a true monolayer of $SiO_2$ is about 3 Å in thickness, such that a full monolayer effectively forms approximately every three cycles, where each cycle is represented by a pair of silicon source gas and oxidant source gas pulses.

Accordingly, the first impurity source gas pulse 306b is preferably conducted after three silicon source gas pulses alternated with three oxidant source gas pulses. In this manner, at least a full monolayer of silicon dioxide is provided prior to introduction of nitrogen doping. More preferably, the first ammonia pulse 306b is provided after six cycles, thereby providing additional insurance against nitrogen diffusion through to the substrate-dielectric interface. In the illustrated embodiment, ammonia is flowed in the first pulse 306b at between about 0 sccm and 10 sccm, more preferably between about 0 sccm and 5 sccm. Thereafter, the ammonia pulses are increased in each cycle by about 50 sccm.

Though not illustrated, the oxidant source gas pulses 304a, 304b, etc. can be reduced in the course of increasing the impurity source gas flow. Accordingly, nitrogen content in the resultant silicon oxynitride dielectric layer can be increased from 0 percent at the lower surface up to stoichiometric $Si_3N_4$ at the upper surface.

Figure 2:
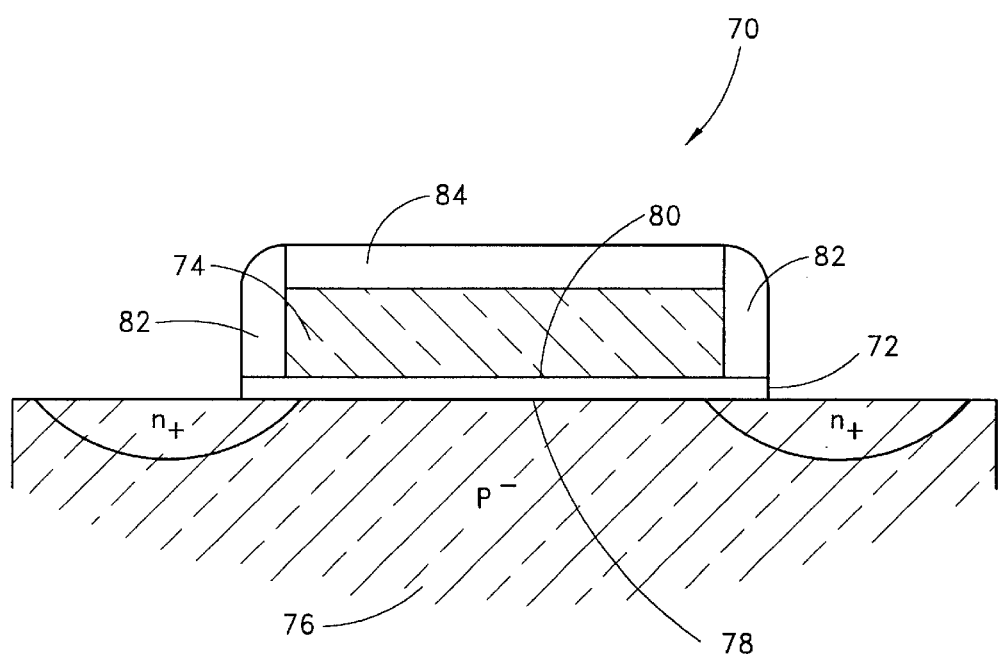
FIG. 2 is a schematic sectional view of a partially fabricated integrated circuit, illustrating a gate dielectric layer sandwiched between a gate electrode and a semiconductor layer.

FIG. 2 shows a schematic sectional view of a transistor structure 70 in a partially fabricated integrated circuit, constructed in accordance with a preferred embodiment, and for which the methods disclosed herein have particular utility. A gate dielectric layer 72 is sandwiched between a gate electrode 74 and a semiconductor substrate 76. The gate dielectric 72 thus extends between a substrate interface 78 and an electrode interface 80. In the illustrated embodiment, the gate electrode 74 comprises a polysilicon layer. The substrate 76 comprises any suitable semiconductor material and in the illustrated embodiment comprises a layer of intrinsically doped single-crystal silicon. In accordance with one embodiment, the gate dielectric 72 comprises silicon oxide having a varying and preferably graded nitrogen content through the thickness thereof. In other embodiments, $Al_2O_3$ can serve as a pure interface with silicon, graded into a higher dielectric constant material such as $ZrO_2$ to provide a higher overall dielectric constant. The gate electrode 74 is additionally protected by sidewall spacers 82 and a dielectric cap layer 84, each of which can comprise conventional insulating materials such as silicon oxide or silicon nitride. The gate electrode 74 can also include high conductivity strapping layers, such as metal nitrides, metal silicides and pure metals, for faster lateral signal transmission.

Figure 3:
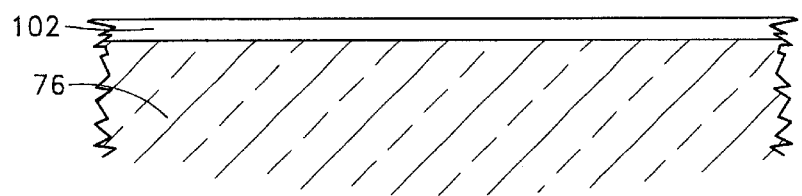
FIGS. 3–6 schematically illustrate monolayer-by-monolayer deposition of a gate dielectric, in accordance with a preferred embodiment of the invention. In the illustrated embodiments, a "monolayer" is formed every few cycles in an alternating, cyclical process.
Figure 4:
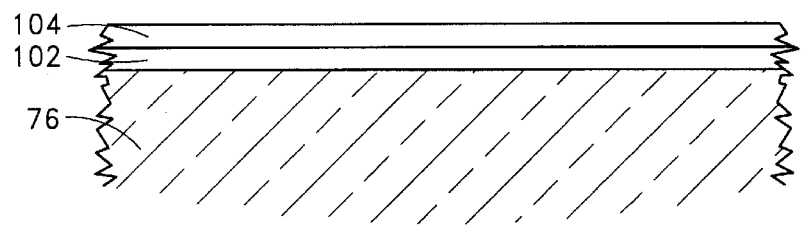
Figure 5:
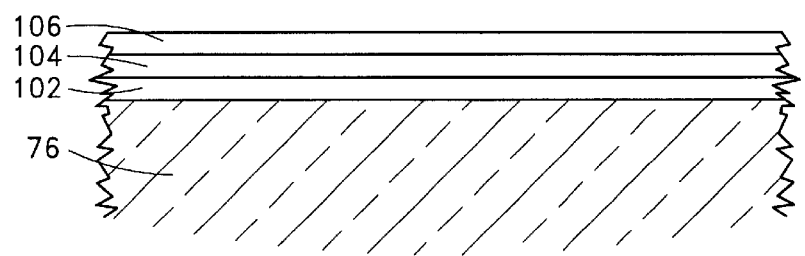

FIGS. 3 through 5 illustrate a sequence of forming the preferred gate dielectric 72 one monolayer at a time. Note that the figures are schematic representations only. In general, the concentration of impurities in each monolayer can vary as desired. In the illustrated embodiment, a linear profile of impurity concentration is preferred. In other arrangements, the impurity concentration can vary exponentially, by step function, etc. through the thickness of thin film.

FIG. 3 illustrates a first monolayer 102 of silicon oxide formed directly on the surface of the semiconductor substrate 76. In accordance with the preferred processing conditions, set forth above with respect to FIG. 7, such a monolayer can be formed after an average of about three cycles of the ALD alternating silicon and oxidant source gas pulses. Desirably, the first or substrate interface monolayer 102 has little or no impurity concentration, preferably lower than about 0.1% impurity, and more preferably the monolayer 102 is formed of pure $SiO_2$.

FIG. 4 illustrates a second monolayer 104 of silicon oxide formed directly on the surface of the first monolayer 102 of silicon oxide. The second monolayer 104 preferably has a low impurity concentration (nitrogen in the preferred embodiment), but greater than the concentration in the preceding monolayer 102.

With reference to FIG. 5, a third monolayer 106 is deposited directly on the surface of the second monolayer 104. In the illustrated embodiment, the third monolayer 106 has yet a higher impurity (nitrogen) concentration than the second monolayer 104. Similarly, a plurality of additional monolayers are deposited one at a time until the desired final thickness is achieved. Each monolayer can have a different impurity concentration and the impurity profile through the thickness of the film can be tailored accordingly.

Figure 6:
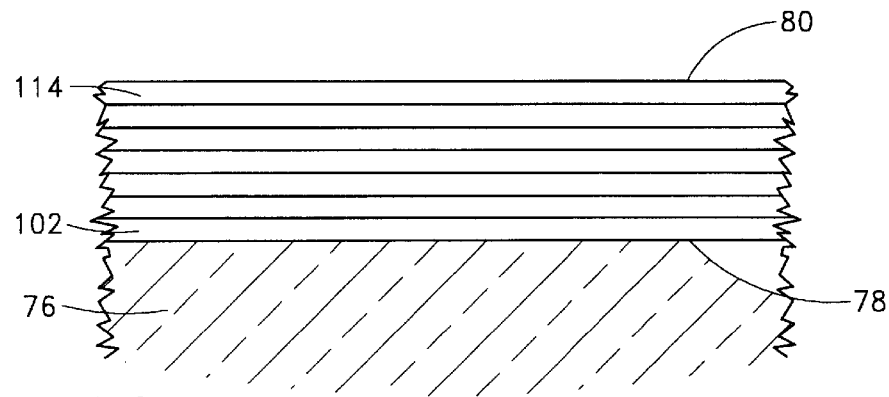

Referring to FIG. 6, a last monolayer 114 is deposited to complete formation of the gate dielectric layer. The last monolayer 114 thus defines the gate electrode interface 80 with conductive material to be deposited thereover. It will be understood, of course, that FIG. 6 is merely schematic and that many more monolayers than the seven illustrated can be employed to form the desired final thickness. Moreover, individual monolayers 102 to 114 would not be sharply definable in the final structure, contrary to the schematic illustration.

In the illustrated embodiments, the impurity concentration is controlled to vary from a lowest concentration at the substrate interface 78 to a highest concentration at the gate electrode interface 80. Preferably, the gate dielectric 72 has a nitrogen concentration at the substrate interface 78 of less than about 0.1%, and more preferably about 0%. Nitrogen content at the gate electrode interface 80, on the other hand, is preferably greater than about 5%, more preferably greater than about 8%, and most preferably greater than about 10%. The nitrogen content between these two interfaces 78, 80 is roughly linearly graded. It will be understood, however, that any other desired grading profile (e.g., parabolic, exponential, elliptical, etc.) can be achieved by tailoring the percentage of nitrogen source gas during each oxidation phase.

The resultant thin film has an actual thickness of less than about 7 nm. Preferably, the gate dielectric has an actual thickness of less than about 6 nm, more preferably less than about 5 nm, and in the illustrated embodiment has a thickness of about 2 nm, including about 7 monolayers. Since the illustrated gate dielectric 72 incorporates a significant nitrogen content, it preferably exhibits an equivalent oxide thickness of less than 2.0 nm, more preferably less than about 1.7 nm and most preferably less than about 1.6 nm. The illustrated linearly graded oxynitride has an equivalent oxide thickness of about 1.7 nm.

Figure 8:
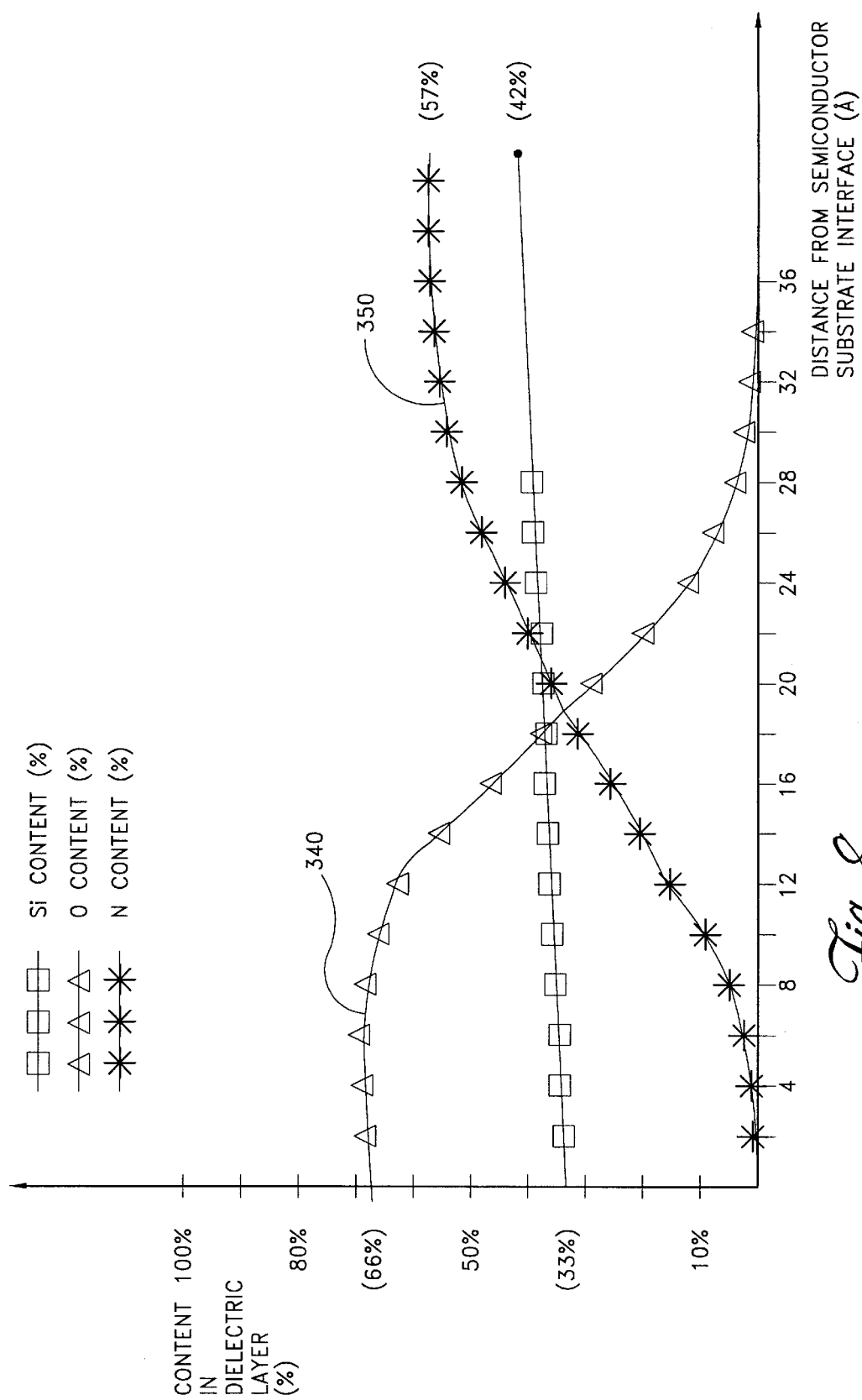
FIG. 8 is a theoretical reverse Auger profile of a graded dielectric layer constructed in accordance with a preferred embodiment.

FIG. 8 is a theoretical reverse Auger profile of a dielectric layer constructed in accordance with a preferred embodiment, illustrating the percentage of impurity content in a dielectric layer as a function of the distance from the semiconductor substrate interface. As shown, in the preferred embodiment, at or near the semiconductor substrate interface, the impurity content 350 (i.e., nitrogen) is at a minimum, whereas the oxygen content 340 is at a maximum. As the distance from the semiconductor substrate interface grows, the impurity concentration 350 increases roughly linearly to a maximum, whereas the oxygen content 340 decrease to a minimum.

Thus, at the substrate interface the gate dielectric preferably comprises nearly pure silicon dioxide ($SiO_2$), whereas near the top of the layer (gate electrode interface) the gate dielectric comprises nearly pure silicon nitride ($Si_3N_4$). It will be understood that such a structure can be created by an ALD process similar to FIG. 7, but where the oxidant pulse amplitudes decrease with every cycle or every few cycles.

Accordingly, despite the extremely low thickness of the preferred gate dielectrics, a precisely controlled impurity content throughout the thickness can be achieved. Thus, in the illustrated embodiment, the interface properties of silicon dioxide are obtained at the substrate surface, while nitrogen is incorporated in the remainder of the gate dielectric to reduce boron penetration and to increase the overall effective dielectric constant of the gate dielectric. Employing ALD enables precise control at the level of atomic layers. Moreover, the low temperatures involved in the deposition allow maintenance of any desired impurity concentration at various points in the thickness, without interdiffusion. In contrast, conventional techniques cannot be so precisely controlled, and tend to result in even distribution of any impurity in such a thin layer, due to diffusion during processing and/or an inherent lack of control during the formation of such a thin gate dielectric layer.

Moreover, grading through the thickness of the layer advantageously enables better control of later processing. For example, the gate dielectric is typically etched over active areas (e.g., source and drain regions of the transistor) in order to form electrical contact to these areas of the substrate. A gradual change in nitrogen content from the upper surface of the gate dielectric down to the substrate interface allows greater control over such etch processes as will be understood by the skilled artisan. Accordingly, damage to the substrate is minimized. The skilled artisan will recognize other advantages to grading profiles in thin films used in integrated circuits.

While the illustrated example comprises grading a nitrogen concentration in a silicon oxide layer, skilled artisan will readily appreciate, in due of the disclosure herein, that the same principles can be applied to forming graded profiles in other gate dielectric materials by ALD. For example, the inventors have found that aluminum oxide advantageously demonstrates a high dielectric constant (k) and also has good interface properties with silicon oxide and/or silicon substrates. Accordingly, a pure aluminum oxide ($Al_2O_3$) layer can be first formed by ALD using alternating pulses of an aluminum source gas and an oxidant.

Exemplary aluminum source gases include alkyl aluminum compounds, such as trimethylaluminum $(CH_3)_3Al$, triethylaluminum $(CH_3CH_2)_3Al$, tri-n-butylaluminum $(n-C_4H_9)_3Al$, diisobutylaluminum hydride $(i-C_4H_9)_2AlH$, diethylaluminum ethoxide $(C_2H_5)_2AlOC_2H_5$, ethylaluminum dichloride $(C_2H_5)_2AlCl_2$, ethylaluminum sesquichloride $(C_2H_5)_3Al_2Cl_3$, diisobutylaluminum chloride $(i-C_4H_9)_2AlCl$ and diethylaluminum iodide $(C_2H_5)_2AlI$. These compounds are commercially available from, e.g., Albemarle Corporation, USA. Other aluminum source gases include aluminum alkoxides containing Al—O—C bonds, such as ethoxide $Al(OC_2H_5)_3$, aluminum isopropoxide $Al[OCH(CH_3)_2]_3$ and aluminum s-butoxide $Al(OC_4H_9)_3$. These compounds are commercially available from, e.g., Strem Chemicals, Inc., USA. The aluminum source can also comprise aluminum beta-diketonates, such as aluminum acetylacetonate $Al(CH_3COCHCOCH_3)_3$, often shortened as $Al(acac)_3$, and tris-(2,2,6,6-tetramethyl-3,5-heptanedionato) aluminum, usually shortened as $Al(thd)_3$, $Al(TMHD)_3$ or $Al(DPM)_3$. Volatile halogenated aluminum beta-diketonates are also commercially available, such as aluminum hexafluoroacetylacetonate $Al(CF_3COCHCOCF_3)_3$, often shortened as $Al(hfac)_3$. These compounds are commercially available from, e.g., Strem Chemicals, Inc., USA. Volatile, purely inorganic aluminum halides such as aluminum chloride $AlCl_3$ or $Al_2Cl_6$, aluminum bromide $AlBr_3$, and aluminum iodide $AlI_3$ may also be used as precursors. At low substrate temperatures, anhydrous aluminum nitrate can be used as an aluminum source chemical for ALD. The synthesis of anhydrous $Al(NO_3)_3$ has been described by G. N. Shirokova, S. Ya. Zhuk and V. Ya. Rosolovskii in *Russian Journal of Inorganic Chemistry*, vol. 21, 1976, pp. 799–802, the disclosure of which is incorporated herein by reference. The aluminum nitrate molecule breaks into aluminum oxide when it is contacted with organic compounds, such as ethers.

Exemplary oxygen source gases include oxygen, water, hydrogen peroxide, ozone, alcohols (e.g., methanol, ethanol, isopropanol), etc.

An exemplary process comprises alternating trimethyl aluminum or TMA with water, with purge pulses or evacuation steps therebetween. Each pulse can have a duration of about 0.5 seconds, and the substrate can be maintained at about 300° C. This process deposits an $Al_2O_3$ layer, which is followed by grading by gradually adding to the ALD process a source gas that results in more desirable bulk properties (e.g., higher dielectric constant). For example, the TMA pulse can be substituted for a zirconium source gas pulse every few cycles, with increasing frequency until pure zirconium dioxide ($ZrO_2$) is formed. In an exemplary process, $ZrCl_4$ serves as a zirconium source gas and can be deposited at the same temperature (e.g., 300° C.) is the aluminum oxide ALD process. Alternatively, zirconium source gas can be introduced simultaneously and as an increasing proportion of the aluminum source gas during a metal pulse, which is continually alternating with an oxidant pulse. In this case, the skilled artisan can determine through routine experimentation what proportions of aluminum source gas to zirconium source gas should be used to obtain the desired material proportions in the layer. Similarly, the skilled artisan will readily appreciate that other gate dielectric materials can also be created in this fashion.

In the above example of aluminum oxide and zirconium oxide, aluminum oxide serves as a good barrier diffusion with good electrical interface properties, while zirconium dioxide provides a higher overall dielectric constant value for the dielectric. The gate dielectric can again be graded from $ZrO_2$ until aluminum oxide forms for the upper interface, providing a good diffusion barrier against downward boron (B) diffusion from the gate electrode into the gate dielectric.

Another example of a graded material for the gate dielectric is silicon oxide at the lower interface, graded into a pure aluminum oxide for the bulk and upper surface of the gate dielectric.

Graded Interface Between Barrier and Metal Layers

FIGS. 9 through 12 illustrate a second embodiment of the present invention. Rather than a dielectric layer, the second embodiment involves a graded conductive film, particularly a graded transition between a barrier layer (e.g., metal nitride) and a more conductive filler layer (e.g., elemental metal).

Figure 9:
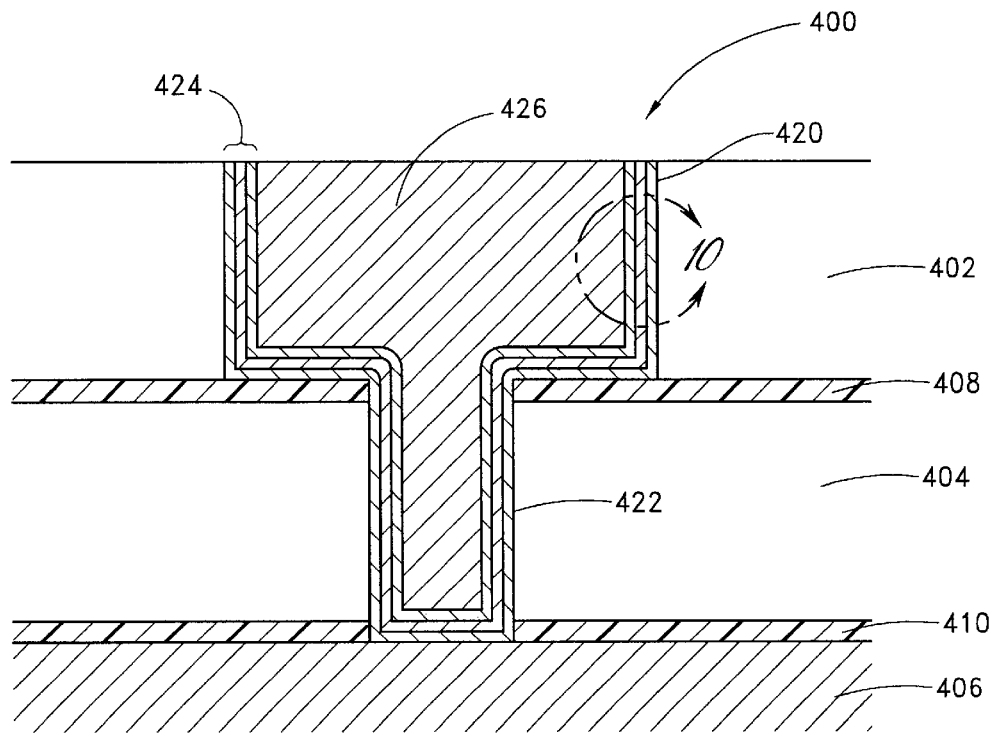
FIG. 9 is a schematic cross-section of a wire and contact formed in a dual damascene trench and via, respectively, including barrier and metal layers.
Figure 10:
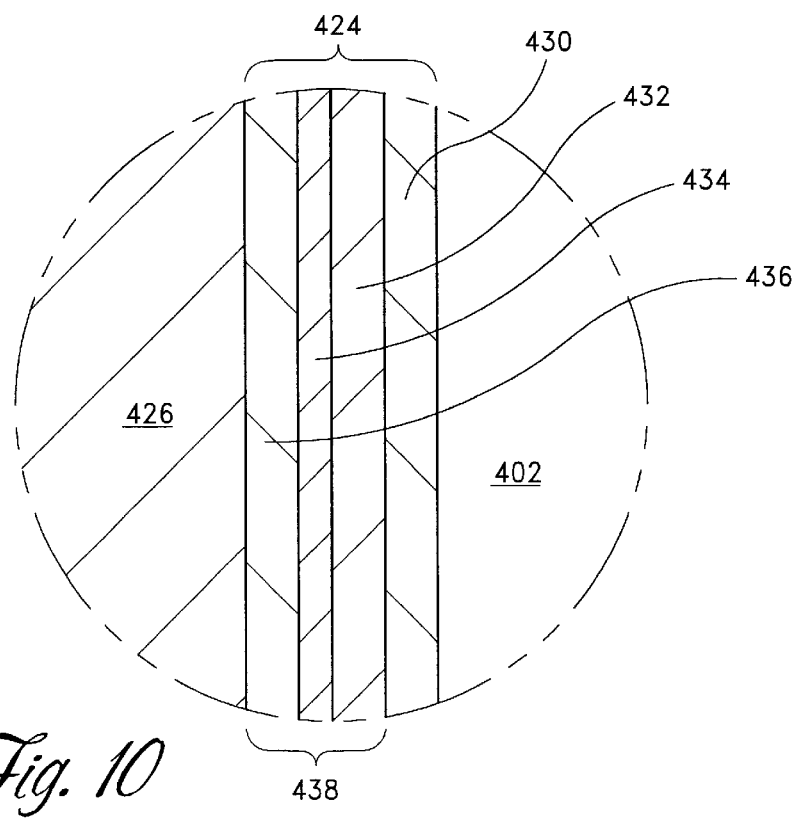
FIG. 10 is an enlarged view of the section 10—10 in FIG. 9, illustrating a graded transition layer formed between the barrier and metal layers.

With reference initially to FIGS. 9 and 10, a dual damascene structure 400 is shown, constructed in accordance with a preferred embodiment. In particular, an upper insulating layer 402 and a lower insulating layer 404 are formed above a conductive circuit element 406. The insulating layers 402, 404 can comprise conventional oxides, such as oxide from tetraethylorthosilicate (TEOS) or borophosphosilicate glass (BPSG), or they can comprise "low k" dielectrics in accordance with advanced process technology. The lower circuit element 406 typically comprises a lower metal layer or landing pad, but in some instances can comprise a semiconductor layer.

The structure 400 is also shown with an etch stop layer 408 between the insulating layers 402, 404, which can serve as a hard mask in the formation of the dual damascene structure, as will be appreciated by the skilled artisan. A lower insulating barrier layer 410 is also shown between the lower insulating layer 404 and the lower conductive layer 406. Such a layer is particularly advisable when the lower conductive element 406 or overlying metal layers comprise copper, which can easily diffuse through typical interlevel dielectrics and cause short circuits. Each of the hard mask 408 and barrier 410 can comprise silicon nitride or silicon oxynitride.

The dual damascene structure 400 is formed by providing trenches 420 in the upper insulating layer 402. The trenches 420 are typically formed in a desired pattern across the workpiece. A plurality of contact vias 422 (one shown) extend downwardly from the trenches 420 in discrete locations along the trenches 420 to expose underlying circuit nodes. Together, the trenches 420 and contact vias 422 are arranged in paths to interconnect underlying and overlying circuit elements in accordance with an integrated circuit design. The trenches and contacts are filled with conductive material to form these interconnects. The conductive material filling trenches 420 are referred to as metal runners, while the portions filling contact vias 422 are referred to as contacts. In dual damascene schemes, as shown, both trenches 420 and vias 422 are filled simultaneously, whereas in other schemes, the contacts and runners can be separately formed.

Typically, the dual damascene trenches and vias are first lined with lining layers 424 and then filled with a highly conductive material 426. In the illustrated embodiment, where the liners 424 are formed on all surfaces of the trenches 420 and vias 422, the liners 424 are conductive. In other arrangements, where the liners are selectively formed only on insulating surfaces, the liners need not be conductive. Lining layers can include adhesion layers, barrier layers and/or seed layers. Preferably, the lining layers 424 include at least two of adhesion, barrier and seed layers, with at least one interface region among the layers comprising a graded region produced by an alternating layer deposition (ALD).

With reference to FIG. 10, the lining layers 424 of the illustrated embodiment include an optional adhesion layer 430, characterized by good adhesion with the insulating surfaces 402, 404, 408, 410 (see FIG. 9) of the dual damascene structure. The adhesion layer can be formed by ALD processes, as disclosed in the provisional patent Application No. 60/159,799 of Raaijmakers et al., filed Oct. 15, 1999 and entitled CONFORMAL LINING LAYERS FOR DAMASCENE METALLIZATION, and the corresponding utility application Ser. No. 09/644,416 of Raaijmakers et al., filed Aug. 23, 2000 of the same title. The disclosure of the '799 application and corresponding '416 U.S. utility application is incorporated herein by reference.

The illustrated lining layers 424 further comprise a barrier region 432, a transition region 434 and a seed layer region 436. Preferably, the barrier region 432 comprises a conductive nitride, and particularly a metal nitride (e.g., WN, TiN, TaN, etc.). The transition region 434 also comprises a conductive nitride, but with varying levels of nitrogen through its thickness and/or different metal content. The seed region 436 preferably comprises a highly conductive "elemental" metal, having conductivity suitable for electroplating the filler metal 426 thereover.

In the illustrated embodiments, the adhesion layer 430 comprises tungsten (W); the barrier region 432 comprises tungsten nitride ($WN_x$); the transition region 434 comprises a graded layer of tungsten copper nitride [$(WN_x)_yCu_z$], where y and z vary through the thickness of the transition region 434; and the seed region 436 comprises copper (Cu). Most preferably, the barrier 432, transition 434 and seed 436 regions are formed in a continuous process without removing the workpiece from the reaction chamber, and so from a process standpoint can be considered regions within a single deposited layer 438 having varying composition through its thickness.

The regions 432, 434, 436 can have any desired thickness suited to the particular application. For the preferred dual damascene context, the liners are preferably as thin as possible while accomplishing their respective purposes. In particular, the barrier region 432 serves as a diffusion barrier but preferably occupies as little of the trench and vias as possible. Accordingly, the barrier region 432 is preferably between about 20 Å and 200 Å, more preferably between about 40 Å and 80 Å, with an exemplary thickness for WN of about 50 Å. The transition region 434 transitions from metal nitride to pure metal while desirably avoiding electromigration during circuit operation and other deficiencies of sharp metal/metal nitride boundaries and minimizing overall thickness. Accordingly, the transition region 434 is preferably between about 7 Å and 200 Å, more preferably between about 10 Å and 80 Å. In one embodiment, the transition region has a thickness of about 10 Å and a copper content of about 0% at the interface with the barrier region 432 and a copper content of about 50% at the interface with the seed region 436 (or with the copper filler, in the absence of a seed layer). The seed region 436 should provide sufficient conductivity for uniform electroplating across the workpiece. While too thick a seed region 436 is not a functional disadvantage, throughput can be increased by depositing a minimum amount of copper by ALD while completing the fill by electroplating. Accordingly, the seed region 436 is preferably greater than about 100 Å, with an exemplary thickness for Cu of about 150 Å. Each of the layers has extremely good step coverage of the dual damascene trenches and vias, preferably greater than about 90% (ratio of sidewall coverage to field coverage), more preferably greater than about 93%, and most preferably greater than about 97%.

With reference to FIG. 11, a theoretical Auger profile is shown for an exemplary transition region 434 of FIG. 10. The right side of the graph represents the lower surface of the transition region 434 as it blends into the underlying WN barrier region 432. The left side of the graph represents the top surface of the transition region 434 as it blends into the overlying Cu seed region 436. As shown, the transition region has a gradually reduced W and N content, going from right to left, with a simultaneously increasing Cu concentration. It will be understood that the shape of the curves can take on any desired shape and the illustrated rates of content grading are merely exemplary.

Advantageously, the process employs an intermediate reduction phase to remove halide tails between metal and nitrogen source phases. This intermediate reduction phase avoids build up of hydrogen halides that could be harmful to metal later to be formed, such as copper. It will be understood, however, that in other arrangements the intermediate reduction phase can be omitted.

TABLE

| Pulse | Carrier Flow (slm) | Reactant | Reactant Flow (sccm) | Temperature (° C.) | Pressure (Torr) | Time (sec) |
|---|---|---|---|---|---|---|
| 1st metal | 400 | $WF_6$ | 20 | 350 | 10 | 0.25 |
| purge | 400 | — | — | 350 | 10 | 1.0 |
| 1st reduce | 400 | TEB | 40 | 350 | 10 | 0.05 |
| purge | 400 | — | — | 350 | 10 | 1.0 |
| nitrogen | 400 | $NH_3$ | 100 | 350 | 10 | 0.75 |
| purge | 400 | — | — | 350 | 10 | 1.0 |
| 2nd metal | 400 | CuCl | 4 | 350 | 10 | 0.2 |
| purge | 400 | — | — | 350 | 10 | 1.0 |
| 2nd reduce | 400 | TEB | 40 | 350 | 10 | 0.2 |
| purge | 400 | — | — | 350 | 10 | 1.0 |

With reference to the Table above, an exemplary process recipe for forming the desired graded layer, including barrier, transition and seed regions, will be described below. Five phases (each phase defined, in the illustrated embodiment, as including purge following reactant pulses) are described:

(1) a first metal phase (e.g., $WF_6$ pulse+purge);

(2) a first reduction phase (e.g., TEB pulse+purge pulse);

(3) a nitrogen phase (e.g., $NH_3$ pulse+purge pulse);

(4) a second metal phase (e.g., CuCl pulse+purge pulse); and (5) a second reduction phase (e.g., TEB pulse+purge pulse).

Varying proportions of these phases are utilized during the continuous deposition process, depending upon the stage of the deposition process. In the illustrated embodiment, during a barrier stage, for example, only phases (1)–(3) are employed, together representing one cycle that leaves no more than about one monolayer of WN. During a transition stage, varying proportions of phases (1)–(3) and (4)–(5) are employed. During a seed stage, only phases (4)–(5) are employed, together representing one cycle that leaves no more than about one monolayer of Cu.

These stages will now be described in more detail below.

Barrier Deposition Stage

During an initial barrier deposition stage, only a barrier material, preferably metal nitride, is deposited. In the illustrated embodiment, only phases (1)–(3) in the Table above are alternated. In about 120–180 cycles, about 50 Å of WN are produced. Each cycle can be identical.

In the first phase (1) of the first cycle, $WF_6$ chemisorbs upon the underlying substrate, which in the illustrated embodiment comprises a previously formed metal nitride. The metal nitride was most preferably formed by a similar ALD process. The first metal source gas preferably comprises a sufficient percentage of the carrier flow and is provided for sufficient time, given the other process parameters, to saturate the underlying barrier layer. No more than about a monolayer of tungsten complex is left upon the barrier layer, and this monolayer is self-terminated with fluoride tails. As noted above, though typically less than one monolayer, this complex will be referred to herein as a "monolayer" for convenience.

After the $WF_6$ flow is stopped and purged by continued flow of carrier gas, a second phase (2), comprising a pulse of reducing gas (TEB), is supplied to the workpiece. Advantageously, the reducing gas removes the fluoride tails from the tungsten complex, avoiding the formation of hydrogen halides that could etch copper. It will be understood that, in other arrangements, this reducing phase may not be necessary.

After TEB flow is stopped and purged, a third phase (3), comprising a pulse of nitrogen source gas ($NH_3$), is supplied to the workpiece. In this third phase, ammonia preferably comprises a sufficient percentage of the carrier flow and is provided for sufficient time, given the other process parameters, to saturate the surface of the metal-containing monolayer. The $NH_3$ readily reacts with the tungsten left exposed by the reducing phase, forming a monolayer of tungsten nitride (WN). The reaction is self-limiting. Neither ammonia nor the carrier gas further reacts with the resulting tungsten nitride monolayer, and the monolayer is left with a nitrogen and $NH_x$ bridge termination. The preferred temperature and pressure parameters, moreover, inhibit diffusion of ammonia through the metal monolayer.

Following the nitrogen phase (3), i.e., after the nitrogen source gas has been removed from the chamber, preferably by purging with continued carrier gas flow, a new cycle is started with the first phase (1), i.e., with a pulse of the first metal source gas ($WF_6$).

Desirably, this three-phase cycle (1)–(3) is repeated until sufficient barrier material is formed, preferably between about 20 Å and 200 Å, more preferably between about 40 Å and 80 Å, with an exemplary thickness of about 50 Å. Advantageously, this thin layer is provided with excellent step coverage.

In the illustrated embodiment, carrier gas continues to flow at a constant rate during all phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

Transition Deposition Stage

Following formation of the barrier region, in a continuous process, the cycles are altered to incorporate new phases during formation of the transition region. In particular, the illustrated fourth and fifth phases (4), (5) are introduced into the cycles, thereby introducing copper to the transition region. At least two, and preferably more than ten cycles, include the phases (4) and (5).

The introduction can be gradual. For example, two cycles can include only phases (1)–(3) as described above, producing WN, followed by a third cycle that includes all five phases (1)–(5), producing a mixture of WN and Cu, followed again by two cycles that include only phases (1)–(3). Gradually, the frequency of Cu introduction is increased. At some point, several cycles in a row would include all five phases (1)–(5).

Two such five-phase cycles are shown in FIG. 12, and the Table above presents parameters for one cycle of an ALD process for depositing of a graded layer of tungsten nitride (WN) and copper (Cu). Preferably the layer serves as an interface between a tungsten nitride barrier layer and a copper seed layer in trenches and contact vias of a dual damascene structure. In the exemplary process recipe, a first metal source gas comprises tungsten hexafluoride ($WF_6$); a carrier gas comprises nitrogen ($N_2$); a first reducing agent comprises triethyl boron (TEB), a nitrogen source gas comprises ammonia ($NH_3$); a second metal source gas comprises copper chloride (CuCl); and a second reducing agent comprises triethyl boron (TEB).

A first five-phase cycle 450 is shown in FIG. 12. Initially, the first three cycles (1)–(3) are conducted as described above with respect to the formation of the barrier region. Following the nitrogen phase (3), i.e., after the nitrogen source gas has been removed from the chamber, preferably by purging with continued carrier gas flow, a fourth phase (4) comprises flowing the second metal source gas. Copper chloride preferably comprises a sufficient portion of the carrier flow and is provided for sufficient time to saturate the surface left by the previous phase. No more than about a monolayer of self-terminated metal complex, particularly chloride-terminated copper, is left over the metal nitride formed by the previous two phases. The second metal source gas is then removed from the chamber, preferably purged by continued carrier gas flow.

In a fifth phase (5), the chloride-terminated surface is then reduced by flowing the reducing agent. Preferably, TEB flows to remove the chloride tails left by the previous phase.

In the next cycle 455, the first phase (1) again introduces the first metal source gas, which readily reacts with the surface of the copper monolayer, again leaving a fluoride-terminated tungsten layer. The second through fifth phases of the second cycle can then as described with respect to the cycle 450. These cycles can be repeated as often as desired to ensure sufficient intermixture of copper and metal nitride to avoid electromigration. A highly conductive layer can be deposited over the interface material by any suitable manner.

More preferably, some cycles are introduced that omit the WN formation, such that only phases (4) and (5) are included. In FIG. 12, this is represented by a truncated cycle 460, which omits the WN phases and instead consists of phases (4)–(5), producing no more than a monolayer of elemental Cu. The process then continues on with another five-phase cycle 470, mixing WN with Cu.

The frequency of WN phases (1)–(3) can be gradually reduced during progressive cycles, thereby increasing the Cu percentage of the growing layer. Eventually, only Cu deposition results. It will be understood that the relative proportion of WN to Cu in the transition region, and its profile, can be finely controlled by controlling the relative frequency of WN phases (1)–(3) as compared to Cu phases (4)–(5). Accordingly, any desirable content profile can be achieved by the methods disclosed herein.

Advantageously, this transition region can have composition variation through a very small thickness of the material. Preferably, the transition region of the illustrated embodiment, between a metal nitride barrier region and a metal seed region, is between about 7 Å and 200 Å, more preferably between about 10 Å and 80 Å, and particularly less than about 50 Å. An exemplary thickness for a metal/metal nitride transition region is about 10 Å. Advantageously, this thin layer is provided with excellent step coverage.

Seed Deposition Stage

Following formation of the transition region, in a continuous process, a seed layer can be deposited in situ over the transition region. In the illustrated embodiment, where a copper fill is desired within dual damascene trenches and contact vias, a seed layer is desired prior to electroplating. Accordingly, the fourth and fifth phases of the illustrated ALD process are repeated after the interface has formed. Thus, copper can be deposited by ALD over the interface of the mixed or compound layer (i.e., over the transition region) to provide a uniformly thick electroplating seed layer.

Desirably, the two-phase cycles are then continued without first metal and nitrogen phases until a copper layer is formed that is sufficiently thick to serve as an electroplating seed layer. This seed layer is preferably greater than about 50 Å, more preferably greater than about 100 Å, and in the exemplary embodiment is about 150 Å.

The wafer can then be removed from the chamber and the trenches and contact vias filled with a highly conductive metal. Preferably, copper is electroplated over the copper seed layer.

Thus, the metal nitride barrier, the graded interface or transition region and the copper seed region can all be deposited in situ in a continuous process, under the same temperature and pressure conditions. Advantageously, the mixed and more preferably graded interface or transition region avoids problems of electromigration that can occur at sharp metal/metal nitride interfaces during electrical operation of the integrated circuit.

The skilled artisan will appreciate that, in some arrangements, the relative level of reactants can be controlled by varying the constituents of a single reaction phase, as disclosed with respect to FIG. 7. Due to the complications of thermodynamic competition between simultaneously exposed reactants in an ALD process, however, it is more preferred to introduce constituent variation into the growing layer of by varying the number and/or type of phases in each cycle of the continuous process, as shown in FIG. 12.

Grading Using Replacement Reactions

In the first of the above-described embodiments, an impurity is described as being introduced in the gas phase as one of the primary reactants (e.g., increasing proportions of nitrogen provided as the same time as the oxidant in the process of FIG. 7). In the second embodiment, the impurity is introduced by separate pulses in selected cycles of the ALD process. Impurity pulses can substitute for pulses in the initial process, or can be provided in addition to the primary reactants, and these pulse introductions can be provided with increasing frequency throughout the process (e.g., the copper source gas pulses can be added to or substituted for tungsten and nitrogen source gas pulses in the process of FIG. 12).

Additionally, the inventors have found that the impurity can be introduced by way of the thermodynamically favored replacement of already-adsorbed species in the growing film. For example, in the process of growing a $TiO_2$ layer by ALD, introduction of an aluminum chloride ($AlCl_3$) gas pulse can replace Ti—O bonds with Al—O bonds, which are thermodynamically favored, and in the process liberate volatile $TiCl_4$ gas. Similarly, a pulse of $AlCl_3$ can convert surface $SiO_2$ to $Al_2O_3$, liberating $SiCl_4$ gas. In another example, $ZrO_2$ at the surface of a growing layer can be exposed to $AlCl_3$ to form $Al_2O_3$. These examples are particularly advantageous in forming an upper interface between bulk $TiO_2$, $SiO_2$ or $ZrO_2$ dielectric and the gate electrode to be formed thereover.

Because the replacement reaction is thermodynamically favored, an extended exposure can replace one or two molecular layers of the less favored oxide with $Al_2O_3$. If such full layer replacement is desired in the grading process, such exposures can be infrequently introduced in the ALD process early in the deposition, with the greater frequency towards the end of the process to produce a largely or purely $Al_2O_3$ upper surface. Conversely, such exposures can be frequently introduced early in the ALD process, and with less frequency later in the process to produce a largely or purely $Al_2O_3$ lower surface graded into the bulk dielectric.

Alternatively, less than full substitution of $Al_2O_3$ for $TiO_2$, $SiO_2$ or $ZrO_2$ can be accomplished in each $AlCl_3$ pulse by selecting a shortened time span for the $AlCl_3$ pulse. The exposure time for the substitution reaction can be progressively increased with each cycle or every few cycles during the process, thus accomplishing a greater proportion of $Al_2O_3$ at the upper surface of the growing dielectric layer. Where grading is accomplished by varying exposure time, it is advantageous to supply reactant gases perpendicularly to the substrate, such as by way of an overhead showerhead inlet. Thus concentration gradients from the inlet side to the exhaust side of the substrate can be avoided.

It has been shown that, even with a positive Gibb's free energy value for a substitution reaction, a long enough exposure to the substituting source gas can result in eventual replacement of the top molecular layer of the growing dielectric. See Jarkko Ihanus, Mikko Ritala, Markku Leskelä and Eero Rauhala, ALE growth of $ZnS_{1-x}Se_x$ thin films by substituting surface sulfur with elemental selenium, APPLIED SURFACE SCIENCE, Vol. 112, pp. 154–158 (1997). In that case, it was shown that exposure of a sulfide or —SH surface termination to pure selenium will result in replacement of the sulfur atoms with selenium.

It will be understood that similar substitution reactions can also be employed for grading conductive materials, such as metal nitrides with different metals per the graded barrier layer described above.

Although the foregoing invention has been described in terms of certain preferred embodiments, other embodiments will become apparent to those of ordinary skill in the art in view of the disclosure herein. In particular, the number of phases for each cycle can be varied. Intermediate reduction phases, for example, may not be necessary in some arrangements. Additionally, while one embodiment is disclosed in the context of conductive thin films lining a dual damascene structure, and another embodiment is disclosed in the context of ultrathin gate dielectric films, the skilled artisan will readily find application for the principles disclosed herein in a number of different contexts.

Accordingly, the present invention is not intended to be limited by the recitation of preferred embodiments, but is intended to be defined solely by reference to the dependent claims.

We claim:

1. A method of forming a thin film with a varying composition in an integrated circuit comprising:
    placing a substrate in a reaction chamber;
    introducing first and second vapor phase reactants in alternate and temporally separated pulses to the substrate in a plurality of deposition cycles; and
    introducing varying amounts of a third vapor phase reactant to the substrate during said plurality of deposition cycles.

2. The method of claim 1, wherein the first vapor phase reactant comprises a silicon source gas.

3. The method of claim 2, wherein the silicon source gas is selected from the group consisting of silanes of the formula $Si_mL_{2m+2}$, siloxanes of the formula $Si_yO_{y-1}L_{2y+2}$, and silazanes of the formula $Si_y(NH)_{y-1}L_{2y+2}$, where m and y are integers and L is a ligand.

4. The method of claim 3, wherein the ligands in the silicon source gas are selected from the group consisting of H, F, Cl, Br, I, alkyl, aryl, alkoxy, vinyl, cyano, isocyanato, amino, silyl, alkylsilyl, alkoxysilyl, silylene and alkylsiloxane groups.

5. The method of claim 3, wherein the second vapor phase reactant comprises an oxidant source gas and the third vapor phase reactant comprises a nitrogen source gas.

6. The method of claim 5, wherein the oxidant source gas comprises water vapor and the nitrogen source gas comprises ammonia.

7. The method of claim 1, wherein the first vapor phase reactant comprises a first metal source gas.

8. The method of claim 7, wherein the second vapor phase reactant is an oxidant and the third vapor phase reactant comprises a second metal source gas different from the first metal source gas.

9. The method of claim 8, wherein the first and second vapor phase reactants produce an interface layer for a gate dielectric, and the third vapor phase reactant produces a higher dielectric constant material.

10. The method of claim 9, wherein the interface layer comprises aluminum oxide.

11. The method of claim 10, wherein the higher dielectric constant material comprises zirconium oxide.

12. The method of claim 1, wherein the first vapor phase reactant is a first metal source gas, the second vapor phase reactant is a nitrogen source gas, and the third vapor phase reactant is a second metal source gas.

13. The method of claim 12, wherein the thin film comprises a graded transition layer between a metal nitride barrier layer and a more conductive material.

14. The method of claim 12, wherein the third vapor phase reactant is a copper source gas.

15. The method of claim 14, wherein the thin film forms a graded transition layer between a metal nitride barrier layer and a copper fill in a damascene trench.

16. The method of claim 15, wherein introducing comprises adding progressively more copper source gas to the deposition cycles.

17. The method of claim 16, wherein introducing varying amounts of the third vapor phase reactant comprises providing copper source gas pulses to the deposition cycles with greater frequency as the deposition proceeds.

18. The method of claim 14, wherein introducing varying amounts of the third vapor phase reactant comprises varying a copper concentration from a lower surface of the transition layer to an upper surface of the transition layer.

19. The method of claim 18, wherein the copper concentration is lowest at the lower surface and highest at the upper surface.

20. The method of claim 19, wherein introducing varying amounts of the third vapor phase reactant comprises linearly grading the copper concentration from the lower surface to the upper surface.

21. The method of claim 19, wherein introducing varying amounts of the third vapor phase reactant comprises providing 0% copper at the lower surface and about 50% copper at the upper surface.

22. The method of claim 19, wherein introducing varying amounts of the third vapor phase reactant comprises forming a pure metal nitride at the lower surface and a pure copper layer at the upper surface.

23. The method of claim 19, forming the graded transition layer with a thickness of less than 50 Å.

24. The method of claim 19, forming the graded transition layer with a thickness of about 10 Å.

25. The method of claim 1, wherein introducing varying amounts of the third vapor phase reactant comprises providing pulses of the third vapor phase reactant to the deposition cycles with varying frequency as the deposition proceeds.

26. The method of claim 25, wherein introducing varying amounts of the third vapor phase reactant comprises providing pulses of the third vapor phase reactant to the deposition cycles with greater frequency as the deposition proceeds.

27. The method of claim 25, wherein introducing varying amounts of the third vapor phase reactant comprises providing pulses of the third vapor phase reactant to the deposition cycles with lesser frequency as the deposition proceeds.

28. The method of claim 1, wherein introducing varying amounts of the third vapor phase reactant comprises providing varying levels of the third vapor phase reactant in each of the deposition cycles as the deposition proceeds.

29. The method of claim 28, wherein the varying levels of the third vapor phase reactant are provided simultaneously with the second vapor phase reactant in each cycle.

30. The method of claim 28, wherein the varying levels of the third vapor phase reactant are provided in separate pulses of varying duration.

31. The method of claim 28, wherein the varying levels of the third vapor phase reactant replace atoms at the surface of the thin film from a previous pulse.

32. The method of claim 1, forming a graded thin film with a thickness of less than about 50 Å.

33. The method of claim 32, wherein introducing varying amounts of the third vapor phase reactant comprises linearly varying an amount of an impurity incorporated into the layer during the deposition.

* * * * *